United States Patent
Kanbara

(10) Patent No.: US 6,621,481 B1
(45) Date of Patent: Sep. 16, 2003

(54) SHIFT REGISTER, DISPLAY DEVICE, IMAGE SENSING ELEMENT DRIVING APPARATUS, AND IMAGE SENSING APPARATUS

(75) Inventor: Minoru Kanbara, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/307,440

(22) Filed: May 10, 1999

(30) Foreign Application Priority Data

May 14, 1998 (JP) .......................... 10-148306
Dec. 7, 1998 (JP) .......................... 10-361967

(51) Int. Cl.[7] .......................... G09G 3/36; G11C 19/00; H04N 5/22
(52) U.S. Cl. ............. 345/100; 348/333.06; 348/333.01; 377/69
(58) Field of Search .................. 377/54, 69, 72, 377/75, 76, 78, 79; 345/87–104, 559; 348/333.01–333.13; G09G 3/36

(56) References Cited

U.S. PATENT DOCUMENTS

| | | | | |
|---|---|---|---|---|
| 4,295,055 A | * | 10/1981 | Takemoto et al. ............. | 377/76 |
| 4,890,308 A | * | 12/1989 | Imai .............................. | 377/79 |
| 4,930,875 A | * | 6/1990 | Inoue et al. ................... | 345/97 |
| 5,222,082 A | * | 6/1993 | Plus .............................. | 377/79 |
| 5,282,234 A | * | 1/1994 | Murayama et al. ........... | 377/69 |
| 5,434,899 A | * | 7/1995 | Huq et al. ..................... | 377/78 |
| 5,510,805 A | * | 4/1996 | Lee ............................... | 345/58 |
| 5,517,150 A | * | 5/1996 | Okumura ....................... | 327/427 |
| 5,631,940 A | * | 5/1997 | Fujikura ....................... | 377/64 |
| 5,701,136 A | * | 12/1997 | Huq et al. .................... | 345/100 |
| 5,859,630 A | * | 1/1999 | Huq .............................. | 345/100 |
| 5,949,398 A | * | 9/1999 | Kim .............................. | 345/100 |
| 6,064,364 A | * | 5/2000 | Katoh et al. .................. | 345/100 |
| 6,064,713 A | * | 5/2000 | Lebrun et al. ................ | 377/67 |
| 6,067,067 A | * | 5/2000 | Park .............................. | 345/100 |
| 6,091,393 A | * | 7/2000 | Park .............................. | 345/100 |
| 6,295,046 B1 | * | 9/2001 | Hebiguchi .................... | 345/100 |
| 6,300,928 B1 | * | 10/2001 | Kim .............................. | 345/92 |
| 6,301,232 B1 | * | 10/2001 | Dutta ............................ | 370/321 |

FOREIGN PATENT DOCUMENTS

WO  97/25716  7/1997
WO  98/26423  6/1998

OTHER PUBLICATIONS

Edwards, M.J. NMOS and CMOS polysilicon drive circuits for liquid crystal displays, Feb. 1994, IEE Proc.–Circuits Devices Syst., vol. 141, No. 1, 50–55.*

Asada, H. et al, "A 2.7in. 1.3M Pixel Driver–Integrated Poly–Si TFT–LCD For Multimedia Projectors", IEEE International Solid State Circuits Conference, vol. 39, Feb. 1, 1996, pp. 190/192, 442 XP000685591.

* cited by examiner

*Primary Examiner*—Wendy R. Garber
*Assistant Examiner*—Justin Misleh
(74) *Attorney, Agent, or Firm*—Frishauf, Holtz, Goodman & Chick, P.C.

(57) ABSTRACT

In a shift register having stages each formed from three to six NMOS transistors, a transistor, which outputs an output signal when an ON voltage is applied to the gate, outputs an output signal from the source. Simultaneously, the gate voltage is increased by the parasitic capacitance between the gate and source. For this reason, the voltage of the output signal rises, and the output signal output from each stage does not attenuate.

32 Claims, 25 Drawing Sheets

SHIFT REGISTER, DISPLAY DEVICE, IMAGE SENSING ELEMENT DRIVING APPARATUS, AND IMAGE SENSING APPARATUS

BACKGROUND OF THE INVENTION

The present invention relates to a shift register, a display device having a driver including the shift register, an image sensing element driving apparatus, and an image sensing apparatus.

In recent years, digital still cameras for recording still images are popularly used. Such a digital still camera has a liquid crystal display device functioning as a viewfinder for displaying an image sensed by an image sensing element and also functioning as a display for displaying an image recorded on an image memory.

As the liquid crystal display devices, active matrix type devices are generally used because of their wide angles of field and good response characteristics. To drive an active matrix type liquid crystal display device, a gate driver for selecting any one of gate lines formed in units of rows of pixels arranged in a matrix on a liquid crystal panel, and a drain driver for receiving a pixel signal in units of gate lines and supplying the received pixel signal to the pixel corresponding to the selected gate line through drain lines are required. Each of the gate and drain drivers is generally formed from a plurality of TFTs. Each TFT outputs a signal supplied to its drain to the source on the basis of a gate signal. The output voltage value changes depending on the voltage value of the gate signal.

Each of the gate and drain drivers is generally constituted by a multistage shift register in which a signal is sequentially transmitted from a preceding stage to the subsequent stage. However, in such a shift register, a circuit immediately before a portion where a signal is output to the next stage must have a so-called EE structure. Thus a perfect OFF resistance can hardly be obtained, so that the output voltage from each stage gradually attenuates.

Some digital still camera can arbitrarily change the direction of an image sensing lens with respect to a camera body. For example, there are cameras capable of rotating a lens unit with an image sensing lens with respect to the main body to photograph an image on the photographer side. In this case, for example, the face of a photographer can be displayed on the liquid crystal display device as a mirror image (vertically inverted image or horizontally inverted image). Conventionally, however, to display a mirror image, complex control must be performed by a controller for supplying an image to the liquid crystal display device to change the read order of image data.

In addition, to display an image freely inverted in the vertical or horizontal, direction in accordance with the photographing situation on the liquid crystal display device of a digital still camera, complex control must be performed by a controller for supplying an image to change the read order of image data.

BRIEF SUMMARY OF THE INVENTION

It is an object of the present invention to provide a shift register which can transmit a signal input to each stage to the next stage without attenuating the signal level and also output an output signal having a high S/N ratio, and is suitable as a driving circuit of a display device.

It is another object of the present invention to provide a display device capable of arbitrarily changing the direction of an image to be displayed by simple control, and an image sensing apparatus having the display device.

In order to achieve the above objects, according to the first aspect of the present invention, there is provided a shift register having a plurality of stages, each of the stages comprising:

a first switching circuit which has a control terminal for receiving a first or second control signal and outputs a driving signal in accordance with the first or second control signal;

a second switching circuit which has a control terminal for receiving the driving signal and discharges a power supply voltage input through a load in accordance with input of the driving signal to this control terminal; and a third switching circuit which has a control terminal for receiving the driving signal and outputs a third or fourth control signal in accordance with input of the driving signal to this control terminal, or a first switching circuit which has a control terminal for receiving a first or second control signal and outputs a driving signal to a line in accordance with the first or second control signal;

a second switching circuit which has a control terminal connected to the line and sets a power supply voltage input through a load to a low potential in accordance with input of the driving signal to this control terminal; and a third switching circuit which has a control terminal connected to the line and outputs a third or fourth control signal in accordance with input of the driving signal to this control terminal.

According to the first aspect, as the transistor characteristics (when a transistor is used as the third switching circuit), the magnitude of the voltage output from the third switching circuit is determined in accordance with the magnitude of the voltage of the driving signal input to the third control terminal of the third switching circuit. When the driving signal is input to the third switching circuit through the third control terminal, the voltage of the third or fourth control signal is stored in the accumulation capacitance between the control terminal of the third switching circuit and the terminal for outputting the third or fourth control signal. Accordingly, the potential at the control terminal increases. Hence, the potential of the third or fourth control signal output from the third switching circuit increases, and a constant voltage can be continuously held without any attenuation in shift to the next stage.

The register may comprise a fourth switching circuit for, in accordance with the power supply voltage input through the load of a predetermined stage, discharging the driving signal input to a next stage of the predetermined stage through the first switching circuit of the next stage. The level of the third or fourth control signal is inverted at a predetermined period. When the level of one of the first and second control signals is inverted in only part of every half period of the level inversion period of the third or fourth control signal, the fourth switching circuit can be turned off in the shift register, even if one of the third and fourth control signals as the output signal from each stage goes high, so the third or fourth signal of high level can be almost directly output as the output from each stage. For this reason, the S/N ratio of the output signal can be made high.

The shift register further comprises a selection control circuit for selectively supplying an externally supplied start signal to one of a first stage and a final stage, a first driving circuit for inputting a Kth driving signal from the third switching circuit of a (K−1)th stage to the first switching circuit of a Kth stage and outputting a (K+1)th driving signal from the third switching circuit of the Kth stage to a (K+1)th stage, a second driving circuit for outputting a (K+2)th driving signal from the third switching circuit of the (K+1)th stage to the Kth stage and outputting the (K+1)th driving signal from the third switching circuit of the Kth stage to the (K−1)th stage, and a shift direction control circuit for selectively driving the first and second driving circuits. With this arrangement, a forward or reverse direction can be selected as the direction in which the third or fourth control signal is output in the shift register.

In order to achieve the above objects, according to the second aspect of the present invention, there is provided a display device having a plurality of pixels, wherein each stage comprises:

a first switching circuit which has a control terminal for receiving a first or second control signal and outputs a driving signal in accordance with the first or second control signal;

a second switching circuit which has a control terminal for receiving the driving signal and discharges a power supply voltage, input through a load, in accordance with input of the driving signal to the control terminal; and a third switching circuit which has a control terminal for receiving the driving signal and outputs a third or fourth control signal in accordance with input of the driving signal to the control terminal; and the display device comprises a selection driving circuit driven in accordance with an externally supplied start signal; and a display element in which the plurality of pixels are arranged for display in accordance with the third or fourth control signal from the selection driving circuit.

According to the present invention, there is also provided an image sensing apparatus comprising:

(A) an image sensing element for generating an image signal corresponding to incident light;

(B) a control circuit having a shift register driven in accordance with an externally supplied start signal, the shift register having a first switching circuit which has a control terminal for receiving a first or second control signal and outputs a driving signal in accordance with the first or second control signal, a second switching circuit which has a control terminal for receiving the driving signal and outputs a power supply voltage, input through a load, in accordance with input of the driving signal to the control terminal, and a third switching circuit which has a control terminal for receiving the driving signal and outputs a third or fourth control signal in accordance with input of the driving signal to the control terminal; and (C) a display element having a plurality of pixels and selected on the basis of the third or fourth control signal from the shift register so as to perform display in accordance with an image signal from the image sensing element.

With this arrangement, the third or fourth control signal to be output from the shift register to the display element can be sequentially output without any attenuation. Especially, a display element having a large number of scanning lines (a large number of pixels) can perform satisfactory display.

The selection driving circuit (control circuit) comprises first selection control means for selectively supplying the start signal to one of a first stage and a final stage, and second selection control means for selecting whether a selection signal received by each stage is to be shifted to an input side or an output side. With this arrangement, an image inverted with respect to a forward-direction image can be displayed without inverting output of a display signal based on an image signal input from the image sensing element or the like to the display element.

As the display element, an arbitrary display panel with pixels arranged in a matrix, e.g., a liquid crystal display panel, an electroluminescence display panel, a plasma display panel, or a field emission display panel can be selected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A and 11B are views showing examples of the forward-direction operation of the digital still camera according to the third embodiment of the present invention, in which FIG. 11A shows a photographing state, and FIG. 11B shows the display state of a display section according to the scanning procedure in a photographing mode and that in a display mode;

FIGS. 12A and 12B are views showing examples of the reverse-direction operation of the digital still camera according to the third embodiment of the present invention, in which FIG. 12A shows the photographing state, and FIG. 12B shows the display state of the display section according to the scanning procedure in the photographing mode and that in the display mode;

FIGS. 17A to 17D are views showing examples of the operation of a digital still camera according to the fourth embodiment of the present invention, in which FIG. 17A shows the display state of the display section when both the gate and drain drivers operate in the forward direction, FIG. 17B shows the display state of the display section according to the scanning procedure in a photographing mode and that in a display mode when the gate driver operates in the forward direction, and the drain driver operates in the reverse direction, FIG. 17C shows the display state of the display section when both the gate and drain drivers operate in the reverse direction, and FIG. 17D shows the display state of the display section according to the scanning procedure in the photographing mode and that in the display mode when the gate driver operates in the reverse direction, and the drain driver operates in the forward direction;

DETAILED DESCRIPTION OF THE INVENTION

The embodiments of the present invention will be described below with reference to the accompanying drawings.

In the first to eighth embodiments to be described below, the present invention is applied to a digital still camera.

First Embodiment

Figure 1:
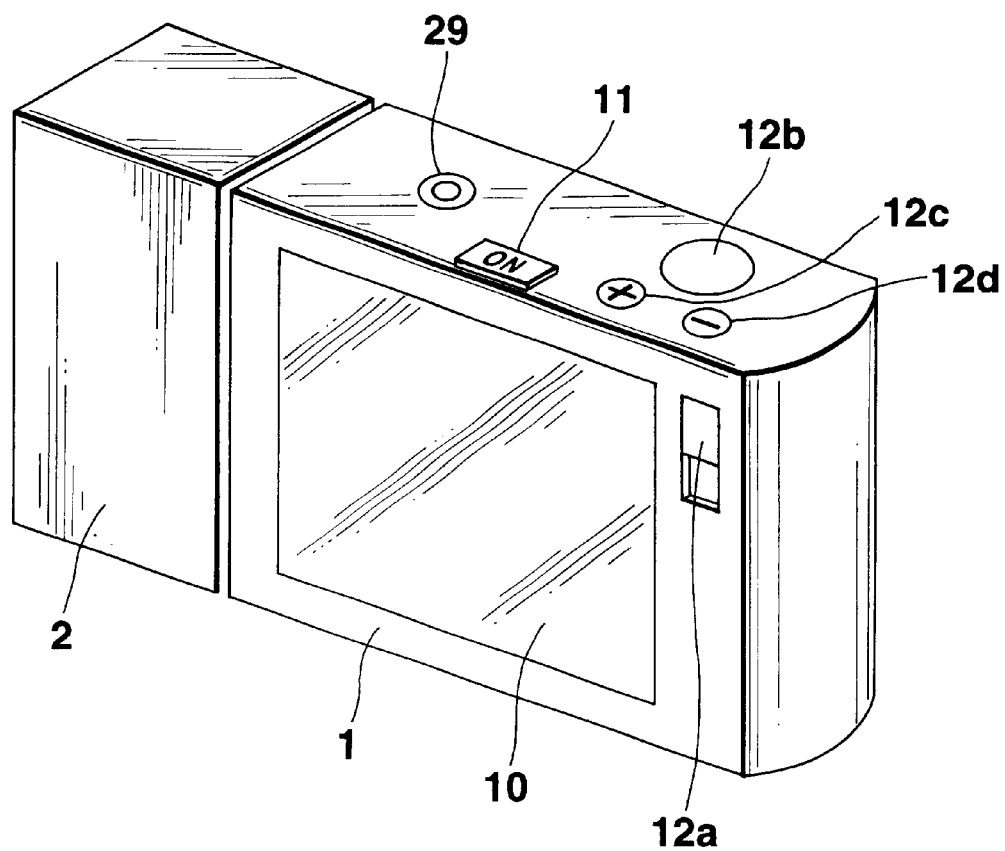
FIG. 1 is a perspective view showing the outer appearance of a digital still camera according to the first embodiment of the present invention.

FIG. 1 is a perspective view showing the outer appearance of a digital still camera according to the first embodiment.

As shown in FIG. 1, this digital still camera comprises a camera body 1 and a lens unit 2.

The camera body 1 has a display section 10 and a mode setting key 12a on its front side. The mode setting key 12a is used to switch between a photographing mode for photographing an image and recording it on an image memory (to be described later) and a reproduction mode for reproducing the recorded image. The display section 10 is formed from a liquid crystal display device. In the photographing mode (monitoring mode), the display section 10 functions as a viewfinder for displaying an image formed by a lens before photographing. In the reproduction mode, the display section 10 functions as a display for displaying a recorded image. The arrangement of the display section 10 will be described later in detail.

The camera body 1 has, on its upper surface, a power key 11, a shutter key 12b, a "+" key 12c, a "−" key 12d, and a serial input/output terminal 29. The power key 11 is slidably operated to power on/off the digital still camera.

The shutter key 12b is used to instruct image recording in the photographing mode and instruct determination of selected contents in the reproduction mode. The "+" and "−" keys 12c and 12d are used to select image data to be displayed on the display section 10 from image data recorded in an image memory in the reproduction mode or set recording/reproduction conditions. The serial input/output terminal 29 receives a cable for transmitting/receiving data to/from an external device (e.g., a personal computer or a printer).

The lens unit 2 has, on its back side, a lens for forming an image to be photographed. The lens unit 2 is mounted on the camera body 1 to pivot through 360° in the vertical direction about its horizontal axis.

Figure 2:
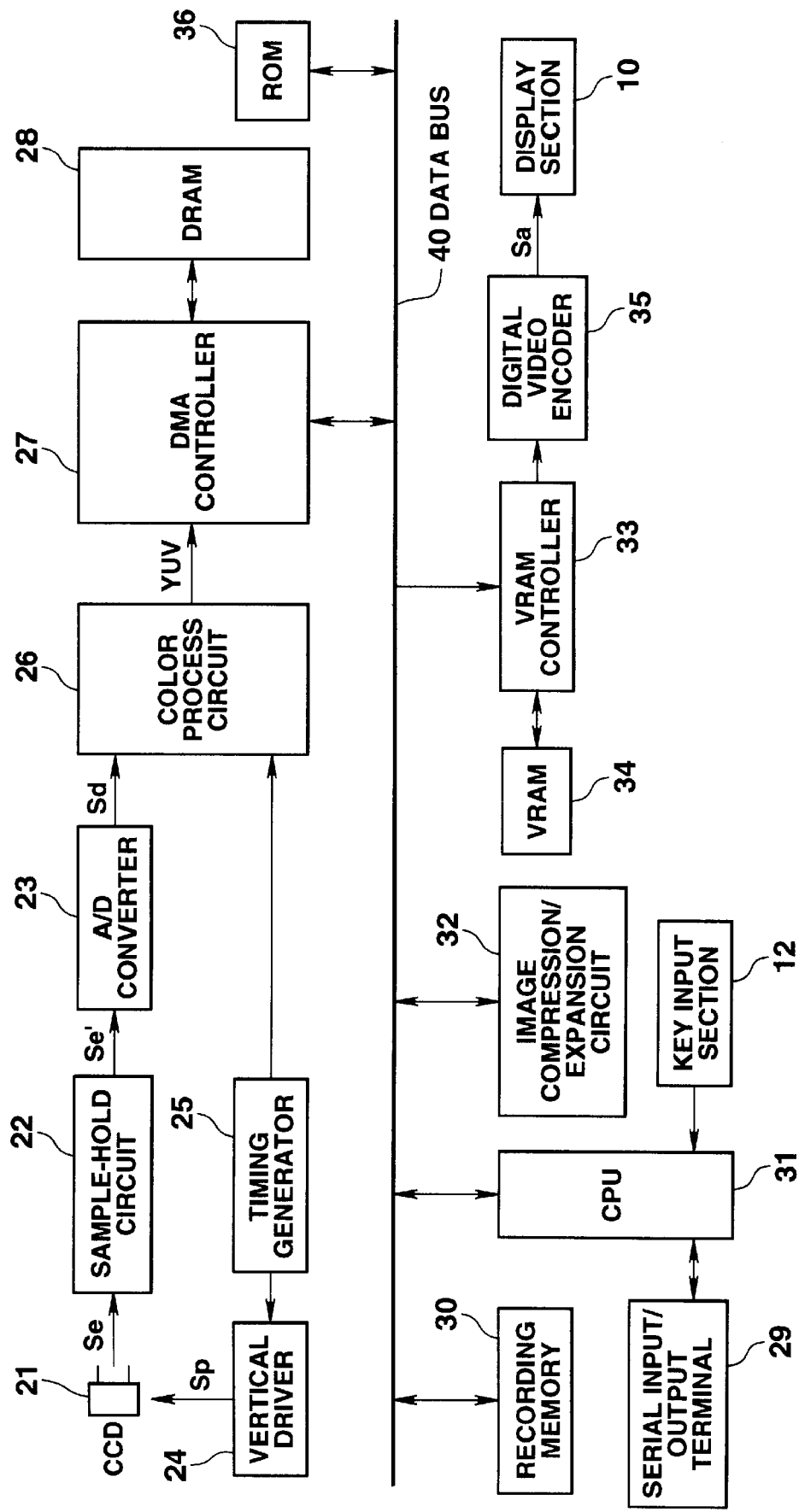
FIG. 2 is a block diagram showing the circuit arrangement of the digital still camera shown in FIG. 1.

FIG. 2 is a block diagram showing the circuit arrangement of the digital still camera shown in FIG. 1.

As shown in FIG. 2, the digital still camera comprises the display section 10, a key input section 12, a CCD (Charge Coupled Device) 21, a sample-hold circuit 22, an A/D (Analog/Digital) converter 23, a vertical driver 24, a timing generator 25, a color process circuit 26, a DMA (Direct Memory Access) controller 27, a DRAM (Dynamic Random Access Memory) 28, the serial input/output terminal 29, a recording memory 30, a CPU (Central Processing Unit) 31, an image compression/expansion circuit 32, a VRAM controller 33, a VRAM (Video Random Access Memory) 34, a digital video encoder 35, and a ROM (Read Only Memory) 36.

Of these elements, the DMA controller 27, recording memory 30, CPU 31, image compression/expansion circuit 32, VRAM controller 33, and ROM 36 are connected through a data bus 40.

The key input section 12 has the above-described mode setting key 12a, shutter key. 12b, "+" key 12c, and "−" key 12d, and inputs a command according to the operations of these keys to the CPU 31.

The CCD 21 receives an image of light, which is formed by the lens, at each of a plurality of pixels arranged in a matrix and stores charges corresponding to the intensity of received light. The CPU 31 executes programs stored in the ROM 36 and controls the respective portions of the circuit. The serial input/output terminal 29 is used for serial data transfer between the CPU 31 and an external device.

The operation of the above circuit will be briefly described below. Operation in the photographing mode will be described first. The photographing mode has two modes:

a monitoring mode for displaying a photographed image on the display section 10, and an image recording mode for recording a photographed image on the recording memory 30 as image data.

In the monitoring mode, the CPU 31 controls the timing generator 25 and color process circuit 26 every predetermined image sensing period to drive the CCD 21 and store charges corresponding to the amount of received light in each pixel. The CCD 21 sequentially outputs an electrical signal Se corresponding to the charges stored in each pixel to the sample-hold circuit 22 on the basis of a driving signal Sp supplied from the vertical driver 24.

The sample-hold circuit 22 outputs an effective component Se' of the electrical signal Se to the A/D converter 23. The A/D converter 23 converts the effective component Se' into digital data Sd and outputs the digital data Sd to the color process circuit 26. The color process circuit 26 generates YUV data as luminance/color difference digital data on the basis of the digital data Sd and outputs the YUV data to the DMA controller 27. The DMA controller 27 sequentially writes the YUV data in the DRAM 28.

Every time YUV data of one frame is written in the DRAM 28, the CPU 31 controls the DMA controller 27 to transfer the YUV data of one frame from the DRAM 28 to the VRAM controller 33 and write the YUV data in the VRAM 34. The digital video encoder 35 line-sequentially reads out YUV data of one frame from the VRAM 34 through the VRAM controller 33 every predetermined period, generates an analog video signal Sa as an image signal on the basis of the readout YUV data, and outputs the analog video signal Sa to the display section 10.

In the image recording mode, when the operator depresses the shutter key 12b while the CCD 21 is sequentially outputting the electrical signal Se to the sample-hold circuit 22, as described above, the CPU 31 controls the timing generator 25 and color process circuit 26 in accordance with a command from the shutter key 12b to stop transferring YUV data from the color process circuit 26 when transfer of YUV data of one frame is complete.

Until transfer of YUV data is stopped, the electrical signal Se of one frame is converted into YUV data through the sample-hold circuit 22, A/D converter 23, and color process circuit 26 and written in the DRAM 28, as in the monitoring mode. The CPU 31 controls the DMA controller 27 to input the YUV data written in the DRAM 28 to the image compression/ expansion circuit 32. The image compression/ expansion circuit 32 compresses the YUV data on the basis of, e.g., JPEG (Joint Photographic Experts Group) and stores it in the recording memory 30.

After the compressed data is stored in the recording memory 30, the CPU 31 starts the timing generator 25 and color process circuit 26 again. With this operation, the mode of the digital still camera automatically returns from the image recording mode to the monitoring mode.

In the reproduction mode, in accordance with the operations of the keys 12a to 12d of the key input section 12, the CPU 31 causes the image compression/expansion circuit 32 to expand compressed image data stored in the recording memory 30. The CPU 31 also controls the DMA controller 27 to transfer the YUV data of one frame, which is expanded by the image compression/expansion circuit 32, from the image compression/expansion circuit 32 to the VRAM controller 33 and write the YUV data in the VRAM 34.

The digital video encoder 35 line-sequentially reads out YUV data of one frame written in the VRAM 34 and generates the analog video signal Sa on the basis of the readout YUV data. The digital video encoder 35 supplies the generated analog video signal Sa to the display section 10. When an image is photographed in the image recording mode, compressed data is recorded on the recording memory 30, and the operation mode of the digital still camera switches from the image recording mode to the monitoring mode, the photographed image may be displayed on the display section 10.

The arrangement of the display section 10 shown in FIGS. 1 and 2 will be described below in detail with reference to the block diagram of FIG. 3.

Figure 3:
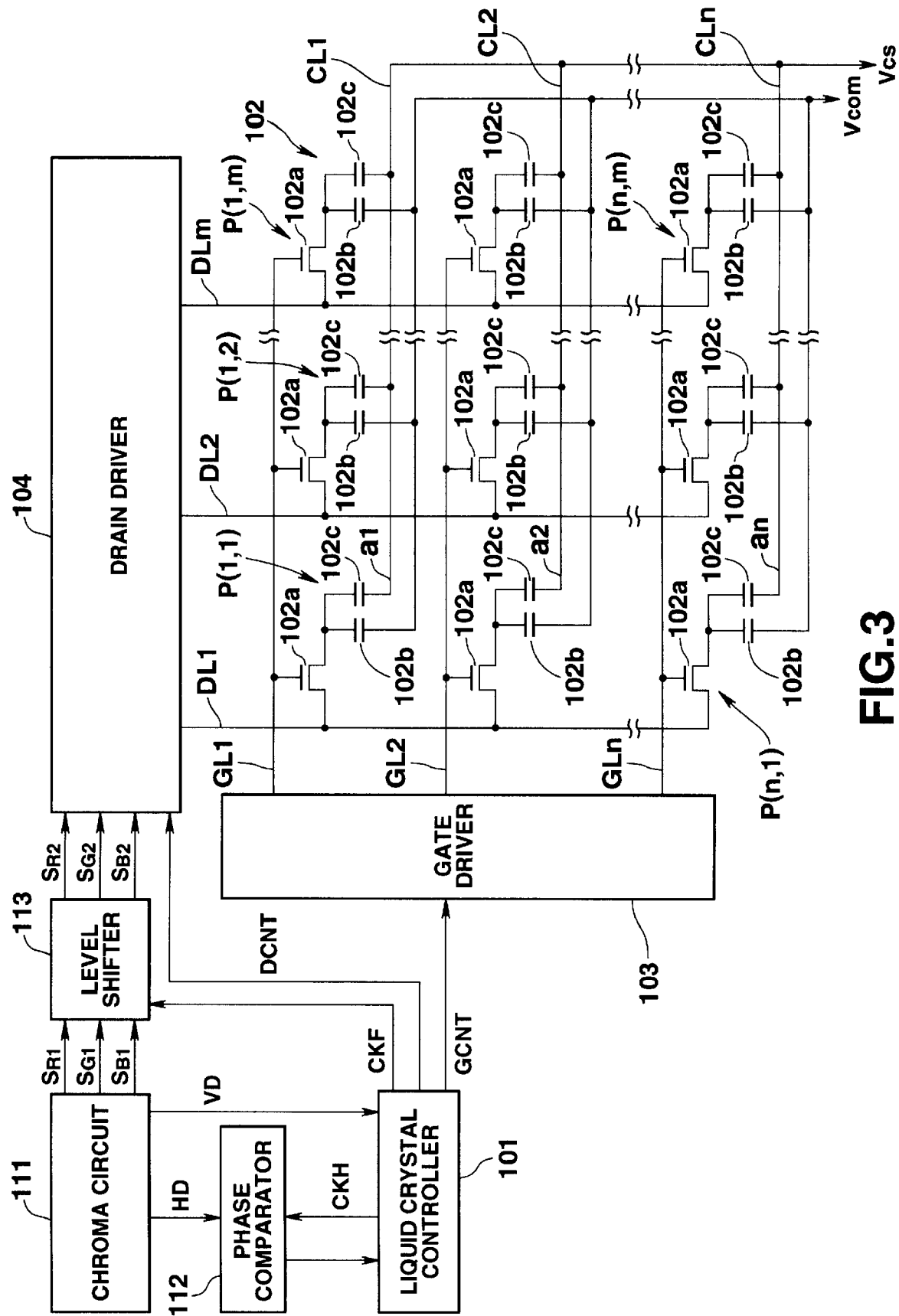
FIG. 3 is a block diagram showing the arrangement of a display section shown in FIGS. 1 and 2.

The display section 10 is constructed by a liquid crystal display device and comprises a chroma circuit 111, a phase comparator 112, a level shifter 113, a liquid crystal controller 101, a liquid crystal panel 102, a gate driver 103, and a drain driver 104, as shown in FIG. 3.

In both the monitoring and image recording modes, the chroma circuit 111 generates analog RGB signals SR1, SG1, and SB1 on the basis of the analog video signal Sa output from the digital video encoder 35. The analog RGB signals SR1, SG1, and SB1 are subjected to gamma correction in accordance with the visual characteristics of the liquid crystal panel 102. The chroma circuit 111 also generates a common voltage Vcom (to be described later). The chroma circuit 111 also performs sync separation processing to separate a vertical sync signal VD and a horizontal sync signal HD from the analog video signal Sa and supplies the signals to the phase comparator 112 and liquid crystal controller 101, respectively.

To AC-drive the liquid crystal of the liquid crystal panel 102 and adjust the brightness of the image to be displayed, the level shifter 113 inverts the polarities of the analog RGB signals SR1, SG1, and SB1 generated by the chroma circuit 111, in units of lines or frames, and also controls the amplitudes and outputs level-shifted analog RGB signals SR2, SG2, and SB2.

The liquid crystal controller 101 incorporates an oscillation circuit and establishes vertical synchronization on the basis of the vertical sync signal VD supplied from the chroma circuit 111. The liquid crystal controller 101 forms a PLL (Phase Locked Loop) using the output from the phase comparator 112 based on a phase comparison signal CKH and establishes horizontal synchronization on the basis of the formed PLL and horizontal sync signal HD. The liquid crystal controller 101 outputs a polarity inversion control signal CKF to the level shifter 113, a control signal group DCNT to the drain driver 104, and a control signal group GCNT to the gate driver 103.

The control signal group GCNT supplied to the gate driver 103 contains signals Φ1, Φ2, CK1, and ⎡CK1 (⎡ represents a logical NOT) and a start signal IN.

The liquid crystal panel 102 is an active matrix type liquid crystal panel having (m×n) pixels and formed by sealing a liquid crystal between a pair of substrates. A common electrode to which the common voltage Vcom (the value of the common voltage Vcom may be changed over time) generated by the chroma circuit 111 and subjected AC level amplification and DC level amplification is applied, is formed on one substrate.

On the other substrate of the liquid crystal panel 102, pixel electrodes corresponding to the pixels and thin-film transistors (TFTs) 102a each having a semiconductor layer formed from amorphous silicon are formed in a matrix. On the other substrate of the liquid crystal panel 102, n gate lines GL1 to GLn extending between the pixel electrodes, m drain lines DL1 to DLm perpendicular to the gate lines GL1 to GLn, and capacitor lines CL1 to CLn parallel to the gate lines GL1 to GLn are respectively formed. In addition, red (R), green (G), and blue (B) color filters corresponding to the analog RGB signals SR2, SG2, and SB2, respectively, are arrayed in a predetermined order on the other substrate of the liquid crystal panel 102.

FIG. 3 shows an equivalent circuit diagram of the liquid crystal panel 102. The gates, drains, and sources of the TFTs 102a are connected to the gate lines GL, drain lines DL, and pixel electrodes, respectively. A pixel capacitance 102b is formed by a pixel electrode, a common electrode, and the liquid crystal sealed between the electrodes. Display signals from drain lines DL are written in the pixel capacitances 102b through the TFTs 102a corresponding to the selected gate lines GL. The aligned states of the liquid crystal molecules forming the pixel capacitances 102b are controlled in accordance with the display signals written in the pixel capacitances 102b. The amount of light transmitted through the liquid crystal changes depending on the aligned state, and the liquid crystal panel 102 displays an image.

Capacitors 102c are formed by the capacitor lines CL1 to CLn, and a gate insulating film and pixel electrodes sequentially stacked on the capacitor lines CL1 to CLn. A capacitor voltage VCS is always applied to the capacitor lines CL1 to CLn. The common voltage Vcom changeable in units of lines is always applied to all common electrodes.

The gate driver 103 is formed from a shift register having n stages corresponding to the number of pixels in the vertical direction of the liquid crystal panel. The gate driver 103 sequentially selects one of the gate lines GL1 to GLn in accordance with the signals Φ1, Φ2, CK1, and ⌈CK1 and start signal IN contained in the control signal group GCNT supplied from the liquid crystal controller 101 and sets the selected gate line in an active state (high level). The arrangement of the gate driver 103 will be described later in detail.

Figure 4:
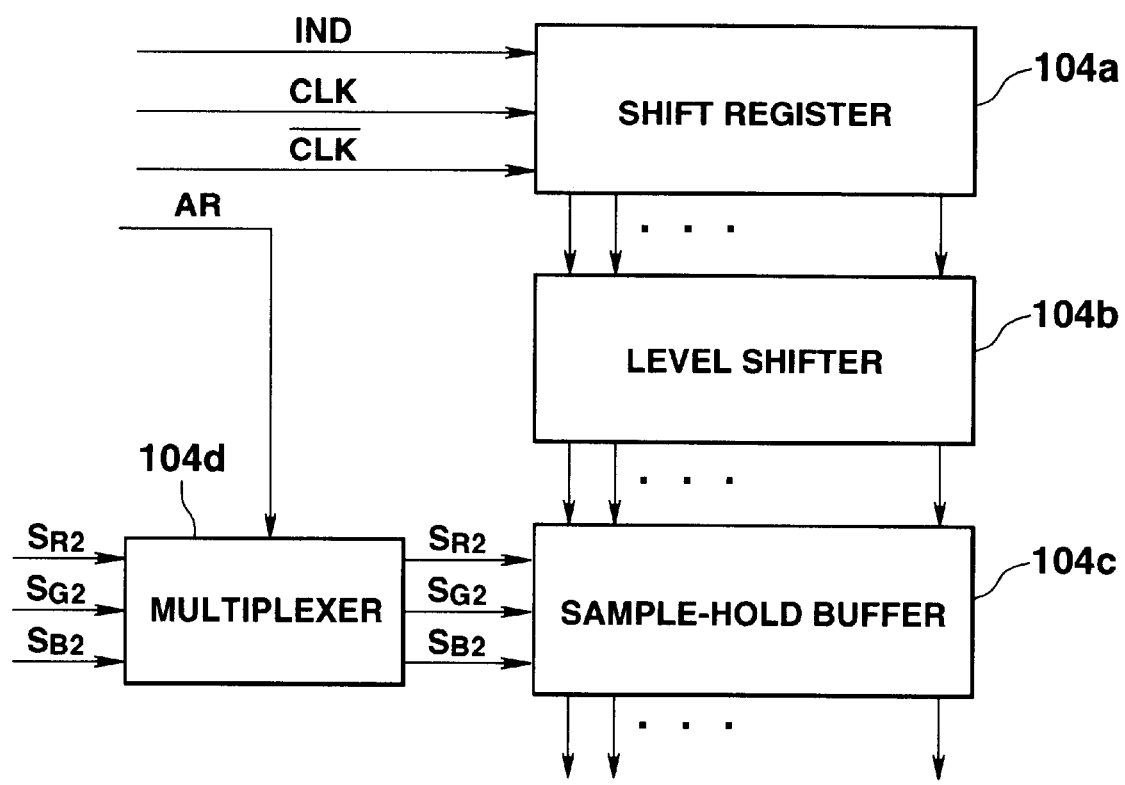
FIG. 4 is a block diagram showing the arrangement of a drain driver shown in FIG. 3.

As shown in FIG. 4, the drain driver comprises a shift register 104a, a level shifter 104b, a sample-hold buffer 104c, and a multiplexer 104d.

The shift register 104a has m stages corresponding to the number of pixels of the liquid crystal panel 102 in the horizontal direction. The shift register 104a receives a clock signal CLK, an inverted clock signal ⌈CLK1, and a start signal IND contained in the control signal group DCNT and generates a sampling signal for sampling the analog RGB signals. The level shifter 104b converts the sampling signal into the operation level of the sample-hold buffer 104c.

The multiplexer 104d aligns the analog video signals SR2, SG2, and SB2 from the level shifter 104b in an order corresponding to the RGB alignment of pixels of the respective lines on the basis of an alignment signal AR contained in the control signal group DCNT and outputs the analog video signals SR2, SG2, and SB2. The sample-hold buffer 104c samples/holds the analog video signals SR2, SG2, and SB2 on the basis of the sampling signal from the level shifter 104b, amplifies the signals with the buffer, and outputs the signals to the drain lines DL1 to DLm.

Figure 5:
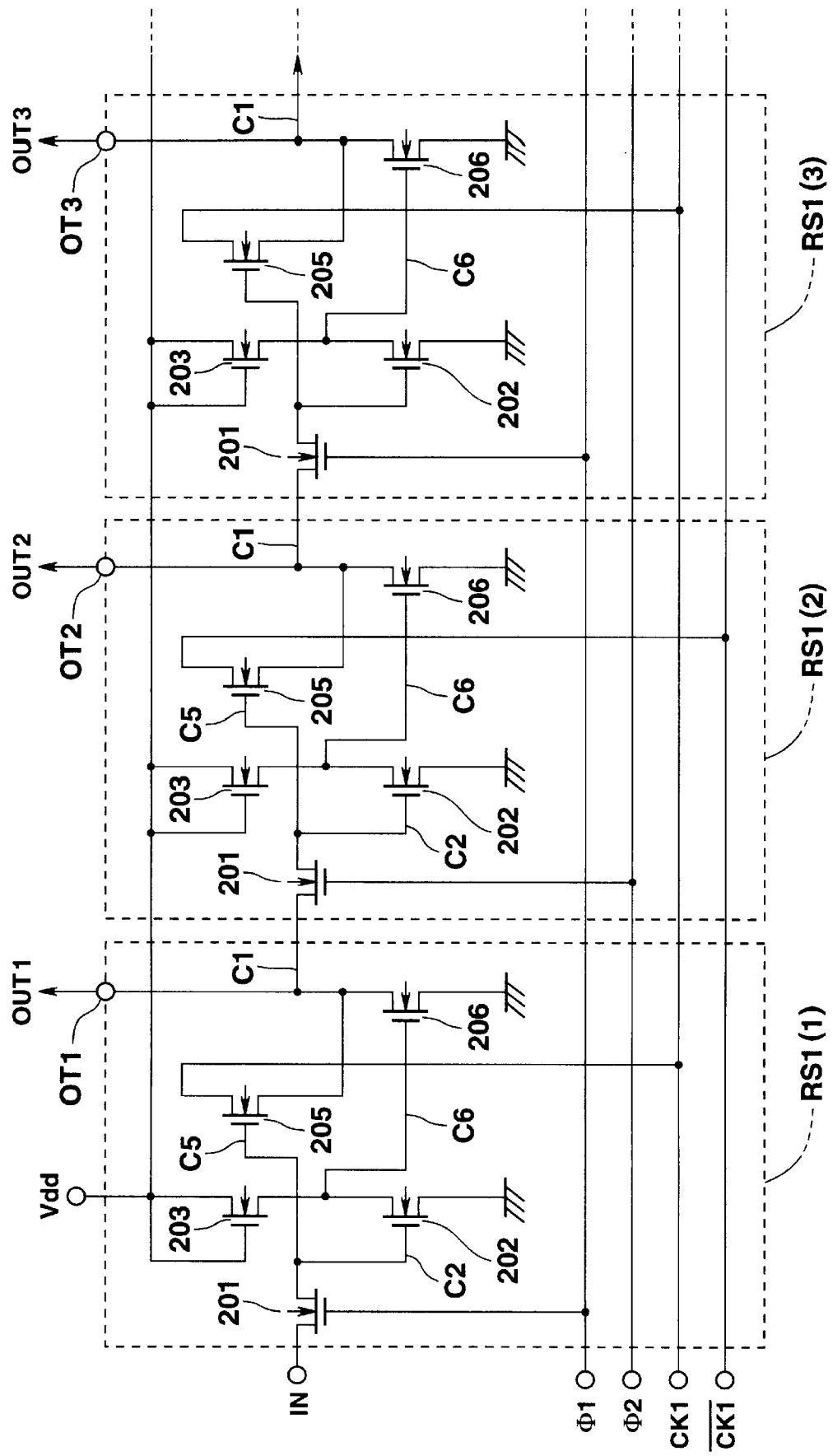
FIG. 5 is a circuit diagram of a gate driver shown in FIG. 3.

The gate driver 103 shown in FIG. 3 will be described below in detail with reference to the circuit diagram of FIG. 5.

Each stage RS1(i) (i=1, 2, . . . , n; n is a positive integer) of the gate driver 103 has five n-channel MOS field effect thin film transistors (to be referred to as transistors hereinafter) 201, 202, 203, 205, and 206. Each of the transistors 201, 202, 203, 205, and 206 has a gate, a gate insulating film, a semiconductor layer, a source, and a drain. The semiconductor layer is formed from amorphous silicon or polysilicon and has n-type impurity regions at portions connected to the source and drain. The transistors 201, 202, 203, 205, and 206 may be formed simultaneously with the TFTs 102a of the display section 10.

Signals applied to the gate of the transistor 201 and the drain of the transistor 205 in an odd-numbered stage RS1(i) (i=1, 3, . . . ) of the gate driver 103 are different from those in an even-numbered stage RS1(i) (i=2, 4, . . . ). More specifically, in an odd-numbered stage, the signal Φ1 is applied to the gate of the transistor 201, and the signal CK1 is applied to the drain of the transistor 205. In an even-numbered stage, the signal Φ2 is applied to the gate of the transistor 201, and the signal ⌈CK1 is applied to the drain of the transistor 205.

The signal Φ1 rises when signal CK1 is at low level. The signal Φ2 rises when the signal CK1 is at high level (i.e., the signal ⌈CK1 is at low level). The signals Φ1 and Φ2 alternately rise and are applied to the gate of the transistor 201 of each odd-numbered stage and the gate of the transistor 201 of each even-numbered stage, respectively.

The arrangement and function of an odd-numbered stage RS1(i) using the first stage: RS1(1) as an example will be described below.

In the first stage RS1(l) of the shift register, the signal Φ1 is applied to the gate of the transistor 201, and the start signal IN is applied to the drain. A current flowing between the drain and source of the transistor 201 when the gate is ON charges line capacitances C2 and C5 formed on lines between the source of the transistor 201 and the gates of the transistors 202 and 205, respectively. The line capacitances C2 and C5 are kept at high level after the transistor 201 is turned off and until the signal Φ1 is applied to turn on the transistor 201 again.

A reference voltage Vdd is applied to the gate and drain of the transistor 203, so the transistor 203 is always ON. When the line capacitance C2 is not charged, and the transistor 202 is OFF, the reference voltage Vdd charges a line capacitance C6 formed on a line between the sources of the transistors 202 and 203 and the gate of the transistor 206. When the line capacitance C2 is charged, the transistor 202 is turned on, and a through current flows between the drain and source of the transistor 202. Since the transistors 202 and 203 have an EE structure, no perfect OFF resistance is formed on the transistor 203. As a consequence, the line capacitance C6 may not be completely discharged but has a voltage sufficiently lower than a threshold voltage Vth of the transistor 206.

The signal CK1 is supplied to the drain of the transistor 205. When the signal CK1 is at high level, a line capacitance C1 formed on a line between the source of the transistor 205 and the drain of the transistor 201 of the second stage is charged. Hence, an output signal OUT1 of high level is output from an output terminal OT1 of the first stage RS1(1).

Since the signal Φ1 is at low level, and the transistor 201 is OFF, the line capacitance C5 is kept charged by the start signal IN. When the transistor 205 outputs the signal OUT1 to the output terminal OT1, the charge in the accumulation capacitance between the gate and source of the transistor 205 increases in accordance with voltage of the signal OUT1. Along with this increase, the gate voltage of the transistor 205 rises until the current flowing between the drain and source may be saturated. As the gate voltage of the transistor 205 rises, the potential of the output signal OUT1 rises, and the transistor 205 obtains a perfect ON resistance. Hence, the level of the signal CK1 is directly output as the level of the output signal OUT1 with little attenuation.

While the output signal OUT1 is being output, the signal Φ2 is applied to the gate of the transistor 201 of the next stage to charge the line capacitances C2 and C5 of the next stage. When the signal CK1 changes from high level to low level, the output signal OUT1 output from the output terminal OT1 of the first stage also goes low.

The arrangement of an even-numbered stage RS1(i) is substantially the same as that of the odd-numbered stage RS1(1) except that the signals Φ1 and CK1 are replaced with the signals Φ2 and ⌈CK1, respectively. In the stages RS1(i) (both even- and odd-numbered stages) from the second stage, the output signals OUT1 to OUT(n−1) from the preceding stages are supplied to the transistors 201. As described above, since the gate voltage of the transistor 205 of each stage is saturated by the line capacitance C5 held between the transistors 201 and 205 and the signal CK1 or ⌈CK1, the output signals OUT1 to OUTn do not attenuate.

The line capacitances C2 and C5 are discharged through the transistor 201 of the same stage and the transistor 206 of the preceding stage when the signal Φ1 (in an odd-numbered stage) or Φ2 (in an even-numbered stage) goes high again. The discharged line capacitances C2 and C5 of each stage RS(i) are not charged again unless the signal Φ1 or Φ2 goes high in the same horizontal period in the next vertical period. Since the transistor 206 in the preceding stage is kept ON during the transistor 201 in the stage is turned on again by the signal Φ1 or Φ2 with the second high level, the line capacitance C1 between the stage and the preceding stage is kept low level state even when the signal CK1 or ⌈CK1 goes, high, and the output signals OUT1, OUT2, . . . output from the output terminals OT1, OT2, . . . , respectively, go high one time in one vertical period 1V.

The operation of the digital still camera according to the first embodiment will be described next.

When the digital still camera is set in the photographing mode (monitoring mode or image recording mode) by the mode setting key 12a, charges are stored in each pixel of the CCD 21 in accordance with an image formed through the lens. The CCD 21 generates the electrical signal Se corresponding to the charges stored in each pixel in accordance with a driving signal supplied from the vertical driver 24 and sequentially supplies the electrical signal Se to the sample-hold circuit 22.

The analog electrical signal Se' as the effective component of the electrical signal Se is input from the sample-hold circuit 22 to the A/D converter 23. The signal is converted into the digital data Sd by the A/D converter 23 and supplied to the color process circuit 26. The color process circuit 26 generates YUV data as luminance/color difference digital data from the digital data Sd and supplies the YUV data to the DMA controller 27. The DMA controller 27 sequentially writes the YUV data in the DRAM 28.

When YUV data of one frame is written, the DMA controller 27 transfers the YUV data of one frame from the DRAM 28 to the VRAM 34 through the VRAM controller 33 under the control of the CPU 31. The digital video encoder 35 line-sequentially reads out YUV data of one frame from the VRAM 34 through the VRAM controller 33 every predetermined period, generates the analog video signal Sa, and outputs it to the display section 10. At this time, the display section 10 operates as will be described later to display the image formed by the lens.

When the user operates the shutter key 12b, the transfer operation of the timing generator 25 and color process circuit 26 is stopped under the control of the CPU 31 in response to a corresponding command. The electrical signal Se of the last frame is converted into YUV data through the sample-hold circuit 22, A/D converter 23, and color process circuit 26 and written in the DRAM 28. This YUV data of this frame is input to the image compression/expansion circuit 32 by the DMA controller 27 and compressed. The compressed data is stored in the recording memory 30.

When the digital still camera is set in the reproduction mode by the mode setting key 12a, the CPU 31 controls the DMA controller 27 to transfer compressed data designated by operating the "+" key 12c or "−" key 12d from the recording memory 30 to the image compression/expansion circuit 32. The compressed data is expanded by the image compression/expansion circuit 32 and written in the VRAM 34 under the control of the VRAM controller 33. The analog video signal Sa is generated by the digital video encoder 35 on the basis of the YUV data written in the VRAM 34 and output to the display section 10. At this time, the display section 10 operates as will be described later to display the recorded image selected by operating the "+" key 12c or "−" key 12d.

In both the photographing and reproduction modes, in the display section 10, the analog video signal Sa is input to the chroma circuit 111 and separated by the chroma circuit 111 into the gamma-corrected analog RGB signals SR1, SG1, and SB1, vertical sync signal VD, and horizontal sync signal HD. The phase comparator 112 measures a timing in the horizontal direction on the basis of the horizontal sync signal HD from the chroma circuit 111 and the phase comparison signal CKH from the liquid crystal controller 101 and outputs a predetermined timing signal to the liquid crystal controller 101.

In accordance with the timing signal and vertical sync signal VD, the liquid crystal controller 101 outputs the control signal group DCNT to the drain driver 104, the control signal group GCNT to the gate driver 103, and the polarity inversion control signal CKF to the level shifter 113. The polarities of the analog video signals SR1, SG1, and SB1 output from the chroma circuit 111 are inverted by the level shifter 113 in units of lines or frames in accordance with the polarity inversion control signal CKF. The analog video signals SR2, SG2, and SB2 which have appropriately undergone polarity inversion are input to the drain driver 104 in accordance with the control signal group DCNT.

The control signal group GCNT generated by the liquid crystal controller 101 contains the start signal IN and signals Φ1, Φ2, CK1, and ⌈CK1. These signals are supplied to the gate driver 103 at timings shown in a timing chart to be described later. When the start signal IN in the control signal group GCNT generated by the liquid crystal controller 101 is supplied to the gate driver 103, the gate driver 103 starts operation.

Figure 6:
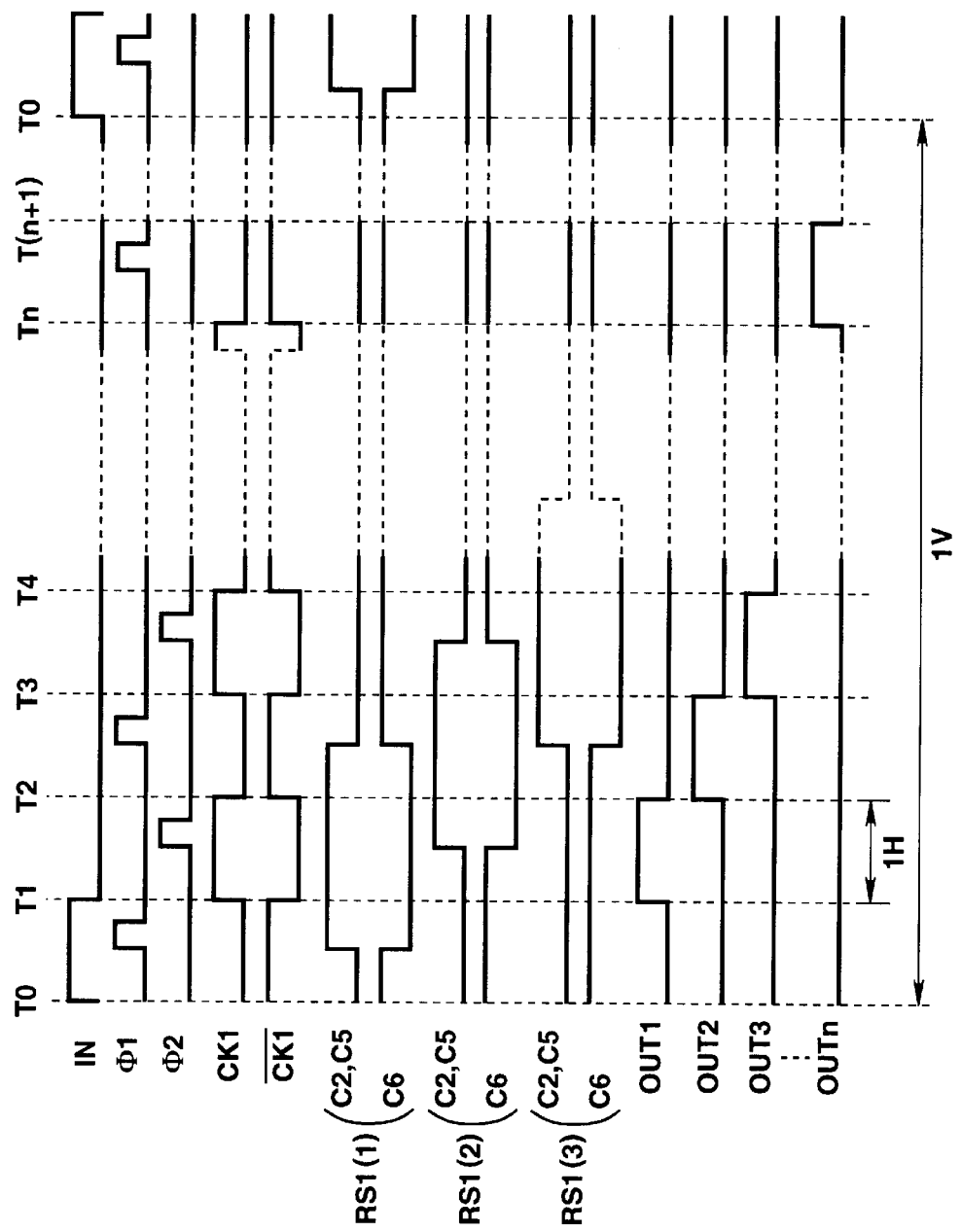
FIG. 6 is a timing chart showing the operation of the gate driver according to the first embodiment of the present invention.

FIG. 6 is a timing chart showing the operation of the gate driver 103.

From time T0 to T1, the start signal IN of high level is supplied from the liquid crystal controller 101 to the drain of the transistor 201 of the first stage. Next, for a predetermined period between times T0 and T1, the signal Φ1 rises to turn on the transistors 201 of the odd-numbered stages. The line capacitances C2 and C5 of the first stage are charged, and the signal goes high.

At this time, the potential at the gate of the transistor 202 of the first stage goes high to turn on the transistor 202 of the first stage. When the transistor 202 of the first stage is OFF, the signal at the line capacitance C6 is set at high level by the reference voltage Vdd supplied through the transistor 203 of the first stage. When the transistor 202 of the first stage is turned on, the reference voltage Vdd supplied through the transistor 203 of the first stage is grounded. More specifically, the line capacitance C6 of the first stage is discharged and the signal at the line capacitance C6 goes low to turn off the transistor 206 of the first stage.

Simultaneously, the potential at the gate of the transistor 205 of the first stage goes high to turn on the transistor 205 of the first stage. This state wherein the signals at the line capacitances C2 and C5 of the first stage are at high level, and the signal at the line capacitance C6 is at low level continues until the signal Φ1 rises between times T2 and T3 to discharge the line capacitances C2 and C5 through the transistor 201 of the first stage.

At time T1, the signal CK1 goes high, and simultaneously, the signal ⌈CK1 goes low. Since the transistor 205 of the first stage is ON, and the transistor 206 of the first stage is OFF, the output signal OUT1 of high level is output from the output terminal OT1 of the first stage and also supplied to the drain of the transistor 201 of the second stage. Assume that the signal CK1 of high level has a voltage VH. The gate voltage of the transistor 205 of the first stage is raised as the output signal OUT1 is boosted, and the drain current flowing to the transistor 205 of the first stage may be saturated. Hence, the output signal OUT1 rarely attenuates and has the voltage VH. The output signal OUT1 goes low when the signal CK1 goes low at time T2.

Even when the signal Φ1 rises between times T0 and T1, the line capacitances C2 and C5 of odd-numbered stages from the third stage are not charged because no signals of high level are supplied to the drains of the transistors 201 of the odd-numbered stages from the third stage. Hence, in the odd-numbered stages from the third stage, the output signals OUT3, OUT5, . . . are kept at low level.

Next, for a predetermined period between times T1 and T2, the signal Φ2 rises to turn on the transistors 201 of the even-numbered stages. The output signal OUT1 charges the line capacitances C2 and C5 of the second stage and goes high.

At this time, the potential at the gate of the transistor 202 of the second stage goes high to turn on the transistor 202 of the second stage. When the transistor 202 of the second stage is OFF, the signal at the line capacitance C6 is set at high level by the reference voltage Vdd supplied through the transistor 203 of the second stage. When the transistor 202 of the second stage is turned on, the reference voltage Vdd supplied through the transistor 203 of the second stage is grounded. More specifically, the line capacitance C6 of the second stage is discharged and the signal at the line capacitance. C6 goes low to turn off the transistor 206 of the second stage.

Simultaneously, the potential at the gate of the transistor 205 of the second stage goes high to turn on the transistor 205 of the second stage. This state wherein the signals at the line capacitances C2 and C5 of the second stage are at high level, and the signal at the line capacitance C6 is at low level continues until the signal Φ2 rises between times T3 and T4 to discharge the line capacitances C2 and C5 of the second stage through the transistor 201 of the second stage and the transistor 206 of the first stage.

At time T2, the signal CK1 goes low, and simultaneously, the signal ⌈CK1 goes high. Since the transistor 205 of the second stage is ON, and the transistor 206 of the second stage is OFF, the output signal OUT2 of high level is output from the output terminal OT2 of the second stage and also supplied to the drain of the transistor 201 of the third stage. Assume that the signal ⌈CK1 of high level has the voltage VH. The gate voltage of the transistor 205 of the second stage, which is held by the line capacitance C5 of the second stage, is raised as the output signal OUT2 is boosted, and the drain current flowing to the transistor 205 of the second stage may be saturated. Hence, the output signal OUT2 rarely attenuates and has the voltage VH. The output signal OUT2 goes low when the signal CK1 goes low at time T3.

Even when the signal Φ2 rises between times T1 and T2, the line capacitances C2 and C5 of the even-numbered stages from the fourth stage are not charged because no signals of high level are supplied to the drains of the transistors 201 of the even-numbered stages from the fourth stage. Hence, in the even-numbered stages from the fourth stage, the output signals OUT4, OUT6, . . . are kept at low level.

In a similar manner, any one of the signals of the output signal OUT1 from the output terminal OT1 of the first stage to the output signal OUTn from the output terminal OTn of the nth stage sequentially goes high and is output until time T(n+1). Any one of the gate lines GL1 to GLn is selected in correspondence with the signal of high level, of the signals from the output signals OUT1 to OUTn of high level. At time T0 of the next vertical period, the start signal IN is supplied from the liquid crystal controller 101, and the same processing as described above is repeated.

In one vertical period 1V, in stages RS1(i) whose output signal OUTi had already been set at high level, no signals of high level are supplied to the gates of the transistors 201 even when the signal Φ1 or Φ2 rises. More specifically, in one vertical period, the gate lines GL1 to GLn are sequentially selected one by one.

During a period (one horizontal period 1H) when one of the gate lines GL1 to GLn is selected by the gate driver 103, the drain driver 104 operates in the following manner in accordance with the control signal group DCNT generated by the liquid crystal controller 101.

The clock signal CLK is sequentially supplied from the liquid crystal controller 101. At this time, a sampling signal is transferred to each stage on the basis of the start signal IND output every gate line GL. The transferred sampling signals are converted into signals of an operation level by the level shifter 104b and sequentially output. The analog video signals SR2, SG2, and SB2 are parallelly input to the multiplexer 104d, aligned in an order corresponding to the RGB alignment of pixels of the respective lines on the basis of the alignment signal AR in the control signal group DCNT, and output. The analog video signals SR2, SG2, and SB2 output from the multiplexer 104d are sequentially sampled in the sample-hold buffer 104c in accordance with the sampling signals from the level shifter 104b and parallelly output to the drain lines DL1 to DLm through the internal buffer.

The display signals supplied to the drain lines DL1 to DLm are written in the pixel capacitances 102b through the TFTs 102a turned on in accordance with selection by the gate driver 103 and held for one horizontal period 1H.

By repeating the above operation, the display section 10 writes the display signals in the pixel capacitances 102b of the pixels of the liquid crystal panel 102. The aligned state changes depending on the aligned state of the liquid crystal molecules, so an image represented by "dark" and "bright" pixels is displayed on the liquid crystal panel 102.

As described above, according to the first embodiment, each stage RS1(i) of the gate driver 103 of the display section 10 does not have the EE structure at a portion immediately before the next stage. For this reason, the signal CK1 or ⌈CK1 of high level can be directly output as the output signals OUT1 to OUTn. Since the gate voltage output to the gate lines GL1 to GLn can be output to the TFTs 102*a* without any attenuation, display errors based on a change in drain current of the TFTs 102*a* due to a change in gate voltage of the TFTs 102*a* can be prevented.

Second Embodiment

A digital still camera according to the second embodiment has substantially the same arrangement and outer appearance as those of the first embodiment. In the second embodiment, however, a signal CK2 is output in place of a signal ⌈CK1 in a control signal group GCNT supplied from a liquid crystal controller 101 to a gate driver in the first embodiment, the signal CK2 changes from low level to high level a predetermined period after a signal CK1 changes from high level to low level, and the signal CK1 changes from low level to high level a predetermined period after the signal CK2 changes from high level to low level. The signal CK2 is supplied to the drains of transistors 205 of even-numbered stages RS1(i) (i=2, 4, 6, . . . , n−1 or n) of a gate driver 103.

The operation of the digital still camera according to the second embodiment will be described below. The second embodiment is different from the first embodiment in that the liquid crystal controller 101 generates the signal CK2 as a signal contained in the control signal group GCNT, and the operation of the gate driver 103 changes because of the difference in signals contained in the control signal group GCNT.

Figure 7:
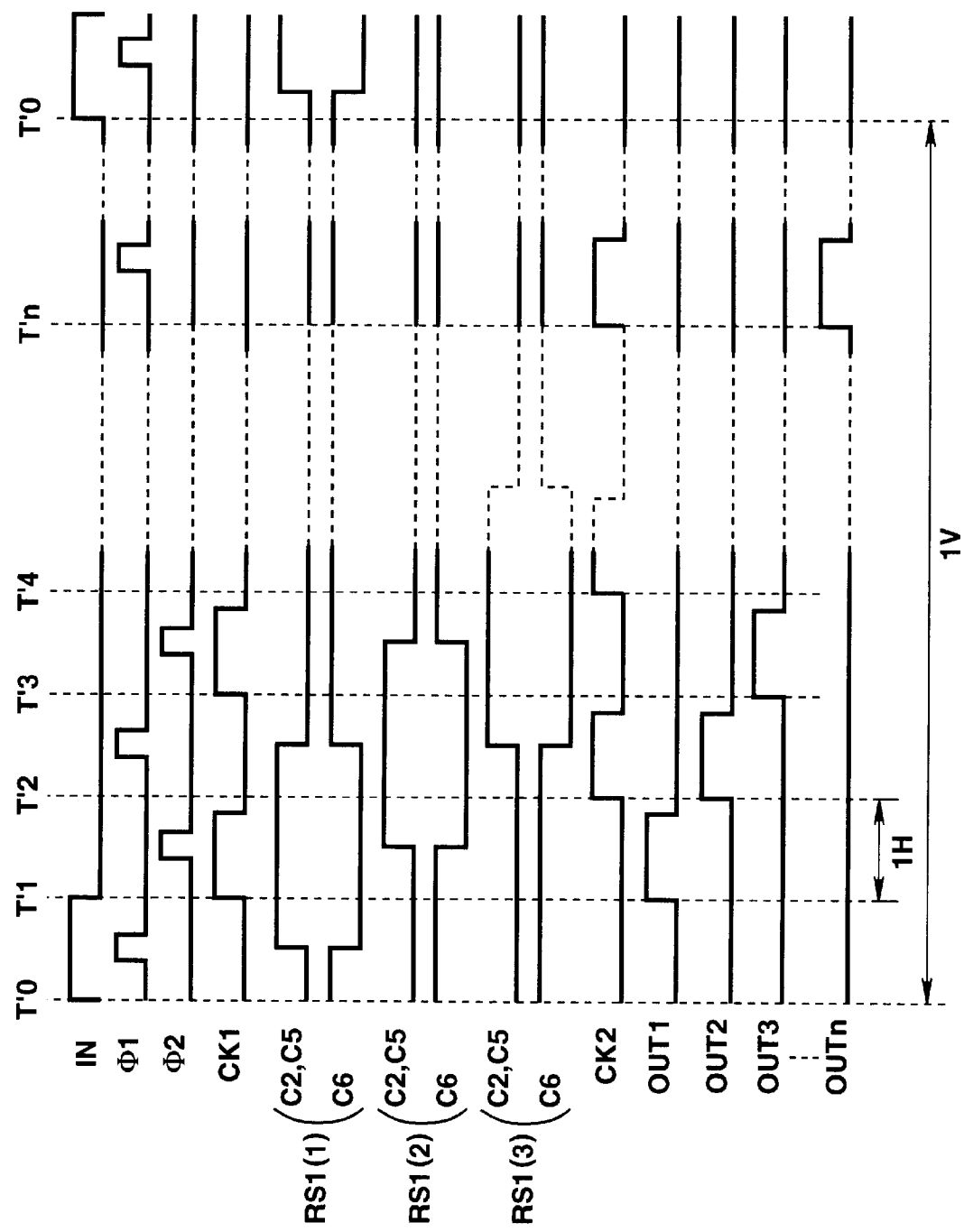
FIG. 7 is a timing chart showing the operation of a gate driver according to the second embodiment of the present invention.

FIG. 7 is a timing chart showing the operation of the gate driver 103 of the second embodiment.

This operation is almost the same as that of the first embodiment described with reference to the timing chart of FIG. 6. Between times T1 and T2, the period when the signal CK1 is at high level is shorter than one horizontal period 1H. An output signal OUT1 from the first stage also goes high only while the signal CK1 is at high level. This also applies to odd-numbered stages from the third stage.

In the second stage, the signal CK2 is supplied to the drain of the transistor 205. In the second stage, an output signal OUT2 goes high only while the signal CK2 is substantially at high level between times T2 and T3. This also applies to even-numbered stages RS1(i) from the fourth stage.

As described above, in the digital still camera of the second embodiment, the period when the signal is supplied to the drains of the transistors 205 of the odd- and even-numbered stages of the gate driver 103 is made shorter than one horizontal period 1H by using the signal CK2 in place of the signal ⌈CK1. The selection period of gate lines GL1 to GLn by the gate driver 103 can be arbitrarily set in accordance with the high level period of the signal CK1 or CK2.

Third Embodiment

A digital still camera according to the third embodiment has substantially the same arrangement and outer appearance as those of the first embodiment except the arrangement of a gate driver 103. Accordingly, signals Φ3 and Φ4 are added to a control signal group GCNT supplied from a liquid crystal controller 101 to the gate driver 103.

Figure 8:
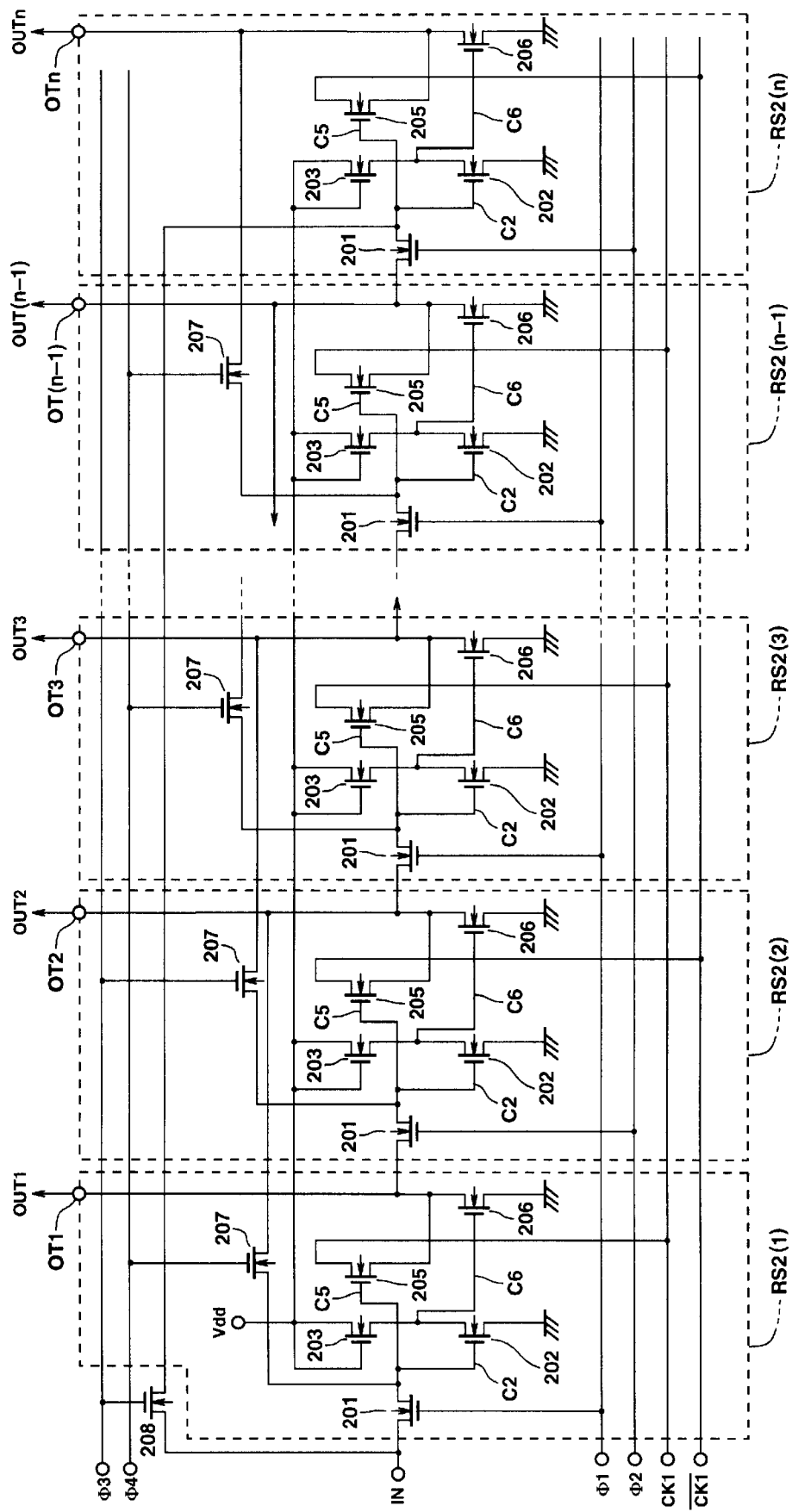
FIG. 8 is a circuit diagram showing the arrangement of the gate driver of a digital still camera according to the third embodiment of the present invention.

FIG. 8 is a circuit diagram of the gate driver 103 of the digital still camera according to the third embodiment.

Each stage of the gate driver 103 has the same arrangement as in the first embodiment (FIG. 5) added with a transistor 207. The gate driver 103 also has a transistor 208 formed independently of the stages.

The transistor 208 is turned on when the signal Φ3 is at high level to supply a start signal IN supplied from the liquid crystal controller 101 to line capacitances C2 and C5 of a final stage RS2(n). When a signal ⌈CK1 goes high, a signal OUTn at substantially the same level as that of the signal ⌈CK1 is output from an output terminal OTn of the final stage RS2(n) to a gate line GLn. When the signal OUTn is output, the signal Φ4 is output to turn on the transistor 207 of a stage RS2(n−1), so the signal OUTn charges the line capacitances C2 and C5 of the preceding stage RS2(n−1). The signal Φ3 output from the liquid crystal controller 101 turns on the transistors 207 of even-numbered stages RS2 (2k) (k is an integer of 1 or more), so a signal OUT(2k+1) from the subsequent odd-numbered stage RS2(2k+1) charges the line capacitances C2 and C5 of the even-numbered stage RS2(2k). The signal Φ4 output from the liquid crystal controller 101 turns on the transistors 207 of odd-numbered stages RS2(2k−1) (k is an integer of 1 or more), so a signal OUT(2k) from the subsequent even-numbered stage RS2(2k) charges the line capacitances C2 and C5 of the odd-numbered stage RS2(2k−1).

When the final stage RS2(n) is an even-numbered stage, the liquid crystal controller 101 is set to invert or phase-shift a signal CK1 in a forward-direction operation and the signal CK1 in a reverse-direction operation (to be described later) with respect to the start signal IN and invert or phase-shift the signal ⌈CK1 in the forward-direction operation and the signal ⌈CK1 in the reverse-direction operation. When the final stage RS2(n) is an odd-numbered stage, the liquid crystal controller 101 is set such that the signal CK1 in the forward-direction operation and the signal CK1 in the reverse-direction operation are in phase with respect to the start signal IN, and the signal ⌈CK1 in the forward-direction operation and the signal ⌈CK1 in the reverse-direction operation are in phase.

When keys 12*a* to 12*d* of a key input section 12 of the digital still camera of the third embodiment are selectively operated, the selection direction of gate lines GL1 to GLn by the gate driver 103 can be set. Instead of preparing these keys, the selection direction of the gate lines GL1 to GLn may be set in accordance with an angle of a lens unit 2 with respect to a camera body 1.

The operation of the digital still camera of the third embodiment will be described below. In this embodiment, a driving operation when the final stage RS2(n) is an even-numbered stage.

The digital still camera of the third embodiment is different from that of the first embodiment only in the operation of the gate driver 103 shown in FIG. 8 and the liquid crystal controller 101. The gate driver 103 sequentially selects the gate lines GL1 to GLn to scan in both the forward direction (GL1, GL2, . . . , GLn) and reverse direction (GLn, GL(n−1), . . . , GL1) in accordance with setting.

The forward-direction scanning operation of the gate driver 103 of the third embodiment will be described first with reference to the timing chart of FIG. 9.

Figure 9:
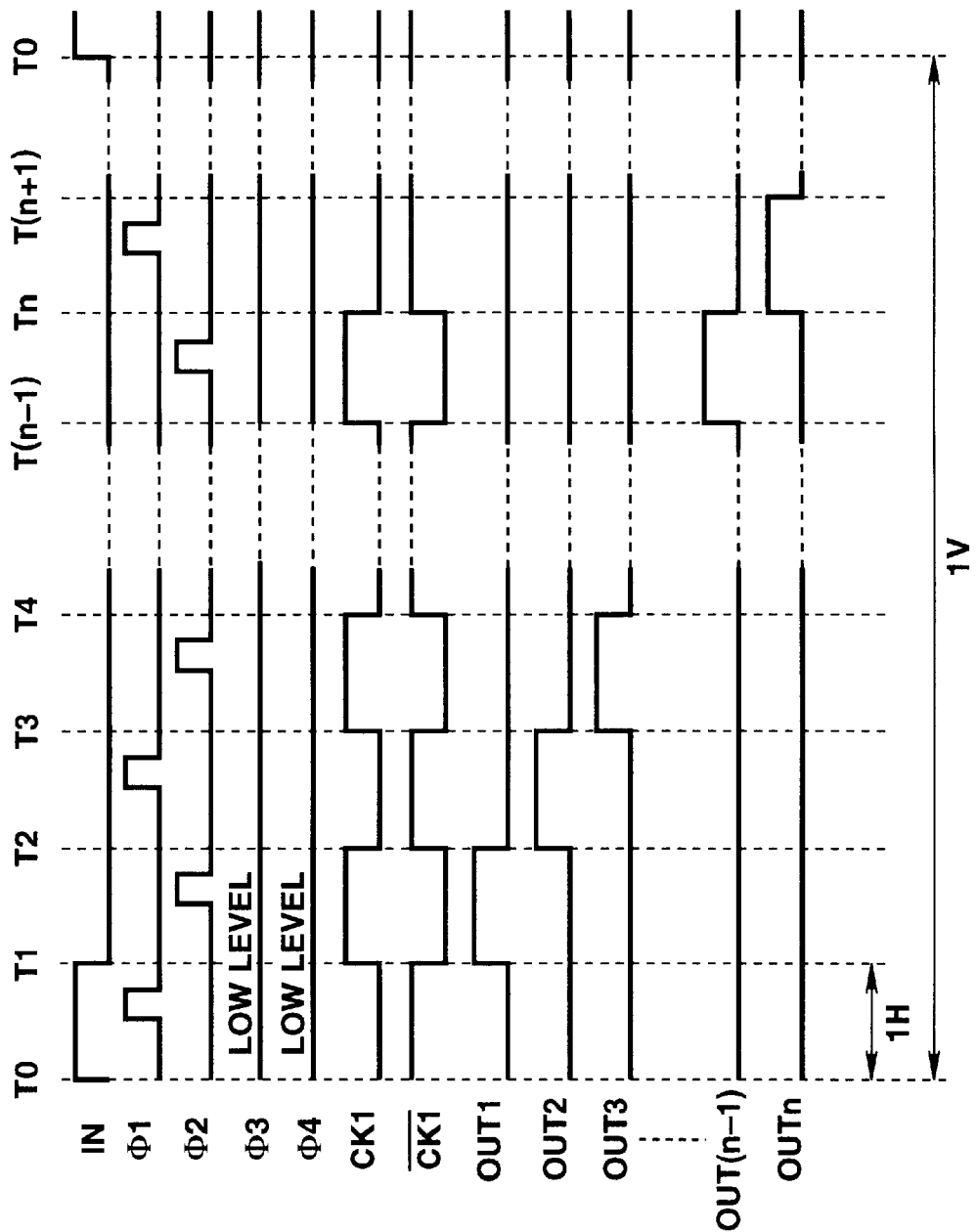
FIG. 9 is a timing chart showing the forward-direction operation of the gate driver according to the third embodiment of the present invention.

As shown in FIG. 9, the signals Φ3 and Φ4 are always at low level. For this reason, the transistors 207 and 208 are always OFF. In this case, the operation of the gate driver 103 is substantially the same as in the first embodiment shown in FIG. 6.

The reverse-direction operation of the gate driver 103 of the third embodiment will be described next with reference to the timing chart of FIG. 10.

Figure 10:
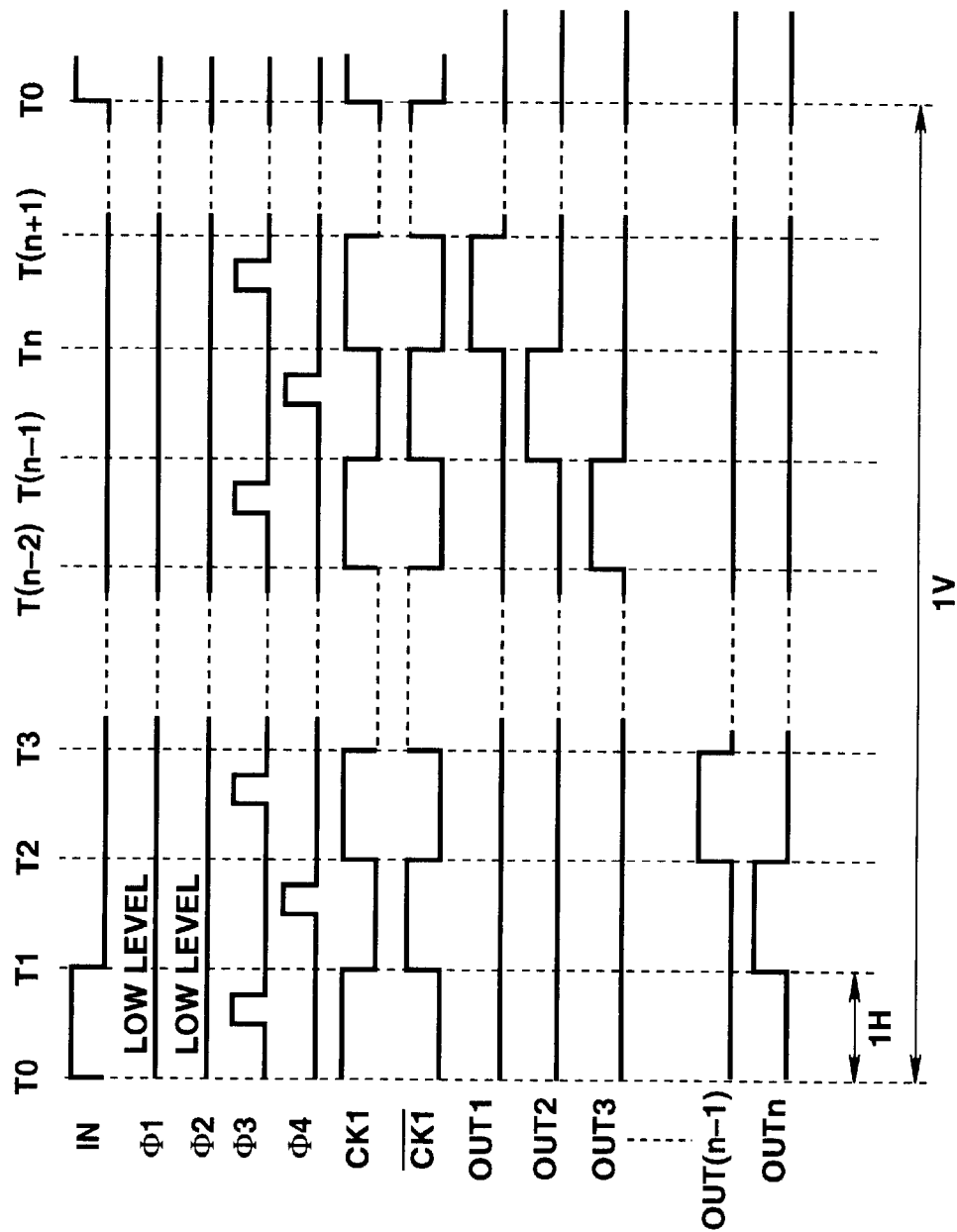
FIG. 10 is a timing chart showing the reverse-direction operation of the gate driver according to the third embodiment of the present invention.

As shown in FIG. 10, signals Φ1 and Φ2 are always at low level. The signals Φ3 and Φ4 alternately go high, like the signals Φ1 and Φ2 in the forward-direction operation.

When the signal Φ3 goes high between times T0 and T1, the start signal IN charges the line capacitances C2 and C5 of the final stage (nth stage). At this time, transistors 202, 203, 205 and 206 in the nth stage operate as transistors 202, 203, 205 and 206 in the first stage in the first embodiment. When the signal ⌈CK1 goes high from time T1 to T2, the output signal OUTn from the final stage goes high.

When the signal Φ4 goes high between times T1 and T2, the transistor 207 of the (n−1)th stage is turned on. The output signal OUTn charges the line capacitances C2 and C5 of the preceding (n−1)th stage. At this time, the transistors 202, 203, 205 and 206 in the (n−1)th stage operate as the transistors 202, 203, 205 and 206 in the second stage in the first embodiment. When the signal CK1 goes high from time T2 to T3, an output signal OUT(n−1) of high level is output from the (n−1)th stage.

By repeating a similar operation, the signals go high in the order of OUTn, OUT(n−1), . . . , OUT3, OUT2, OUT1 every horizontal period, and the gate lines are selected in the order of GLn, GL(n−1), . . . , GL3, GL2, GL1.

The operation of the digital still camera of the third embodiment will be described below using a specific example. In this case, the mode setting key 12a is set in the photographing mode.

Figure 11A:
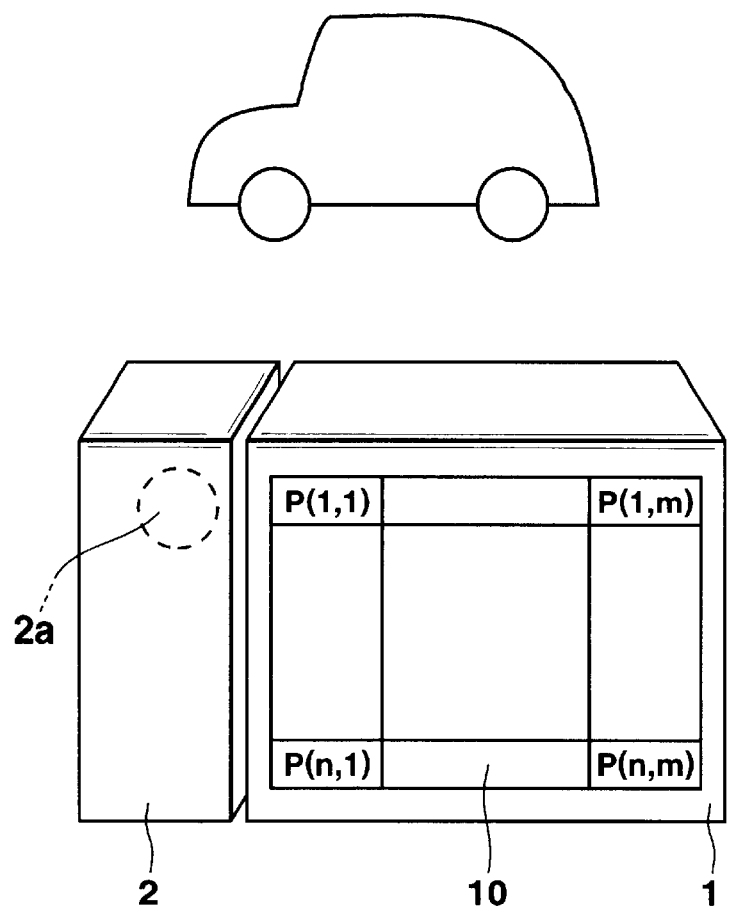

The operation of the digital still camera when the image of an object in front of the photographer is to be photographed, as shown in FIG. 11A, will be described. In this case, the photographer photographs the image while setting a lens 2a of the lens unit 2 on the same side as that of a display section 10 of the camera body 1, i.e., pivoting the lens unit 2 to make an angle of almost 0° with the camera body 1. The keys 12a, 12b, 12c, and 12d of the key input section 12 are operated in this state to set the scanning direction of the gate lines GL1 to GLn by the gate driver 103 to the forward direction. At this time, pixels P(1,1) to P(n,m) of the liquid crystal panel 102 are arranged along the original vertical and horizontal directions of the liquid crystal panel 102, as shown in FIG. 11A.

In this state, the vertical direction of the lens unit 2 matches the vertical direction of the image. For this reason, a CCD 21 is driven by a vertical driver 24 such that charges corresponding to the image formed through the lens 2a of the lens unit 2 are received by the pixels of the CCD 21 while horizontally scanning the image from the left to the right and vertically scanning it from the upper side to the lower side of FIG. 11A. Electrical signals Se' as the effective components of the respective pixels are output from a sample-hold circuit 22 in the same order as that of scanning.

In the display section 10, analog RGB signals SR2, SG2, and SB2 generated on the basis of an analog video signal Sa supplied from a digital video encoder 35, and level-shifted by a level shifter 113 are sequentially supplied to a multiplexer 104d. The analog RGB signals SR2, SG2, and SB2 output from the multiplexer 104d are sequentially received by a sample-hold buffer 104c along arrows in the horizontal direction of the display section 10 shown in FIG. 11B, and display signals are sequentially supplied to the drain lines DL1 to DLm every horizontal period 1H.

Figure 11B:
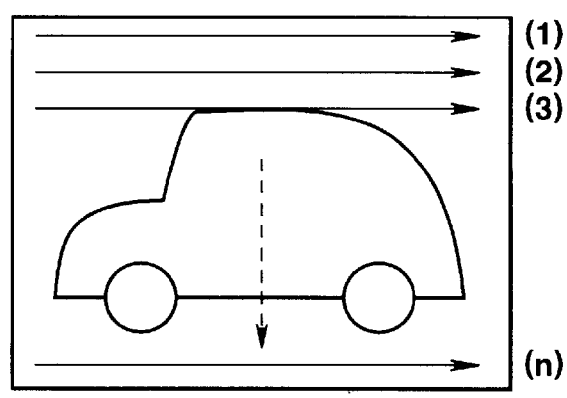

On the other hand, the gate driver 103 sequentially selects the gate lines GL1, GL2, . . . , GLn in the order named from the upper side to the lower side, as shown in FIG. 11B, in accordance with the control signal group GCNT from the liquid crystal controller 101. With this operation, the liquid crystal panel 102 is driven to display an image in the same direction as that of the photographed image, as shown in FIG. 11B.

Figure 12A:
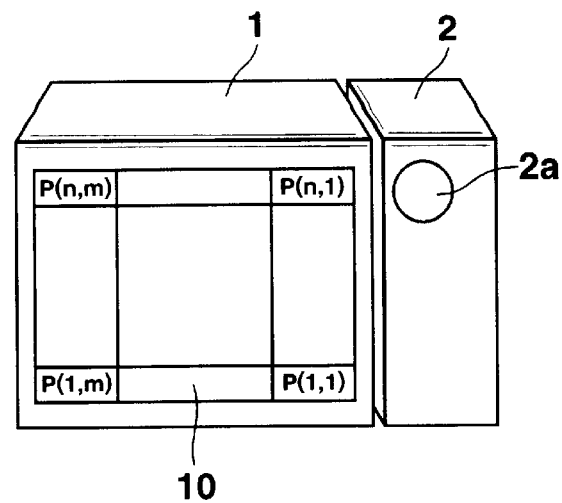
Figure 12A:
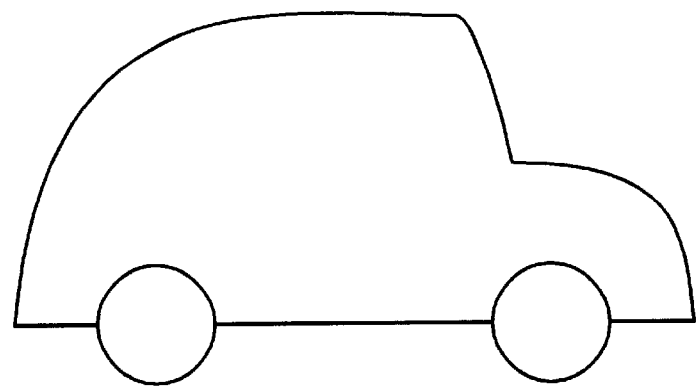

The operation of the digital still camera when the image of an object, e.g., the photographer himself/herself on the display section 10 side is to be photographed, as shown in FIG. 12A, will be described next. In this case, the photographer photographs the image while setting the lens 2a of the lens unit 2 on the same side as that of the display section 10 of the camera body 1, i.e., vertically pivoting the lens unit 2 or camera body 1 through about 180° with the forward-direction arrangement. Hence, the pixels P(1,1) to P(n,m) of the liquid crystal panel 102 are inverted along the vertical and horizontal directions in FIG. 11A. In addition, the keys 12a, 12b, 12c, and 12d of the key input section 12 are operated to reverse the scanning direction of the gate lines GL1 to GLn by the gate driver 103.

In this state, the CCD 21 is driven while horizontally scanning the image from the right to the left and vertically scanning it from the lower side to the upper side of FIG. 12A. Hence, the vertical and horizontal directions of charges to be received by the pixels of the CCD 21 in accordance with the image formed through the lens 2a of the lens unit 2 are reversed. In the display section 10, when the analog video signal Sa is supplied from the digital video encoder 35 with the same operation as in forward-direction driving, the analog RGB signals SR2, SG2, and SB2 reversed in the vertical and horizontal directions are supplied from the level shifter 113 to the multiplexer 104d. At this time, the multiplexer 104d outputs the analog RGB signals SR2, SG2, and SB2 to the sample-hold buffer 104c in the order indicated by arrows in the horizontal direction of FIG. 12B. More specifically, the analog RGB signals SR2, SG2, and SB2 to be supplied to the sample-hold buffer 104c are output in the same direction as in FIG. 11B and consequently reversed to FIG. 11B in the horizontal direction. The sample-hold buffer 104c supplies display signals reversed in the horizontal direction to the drain lines DL1 to DLm.

Figure 12B:
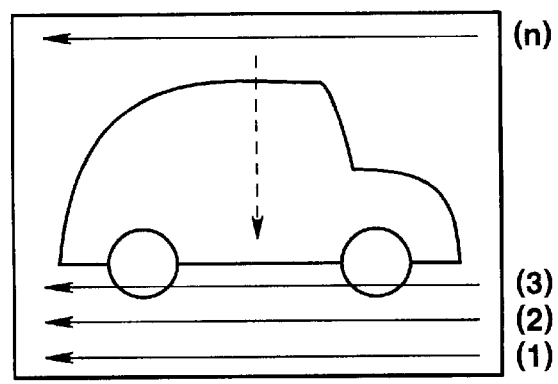

On the other hand, the gate driver 103 sequentially selects the gate lines GLn, . . . , GL2, GL1 in the order named, as shown in FIG. 12B, in accordance with the control signal group GCNT from the liquid crystal controller 101. With this operation, the liquid crystal panel 102 is driven to display a mirror image of the photographed image, as shown in FIG. 12B.

As described above, in the digital still camera of the third embodiment, the scanning order of the gate lines GL1 to GLn is reversed by controlling the signals Φ1 to Φ4 supplied from the liquid crystal controller 101 to the gate driver 103. Only with this arrangement, a mirror image inverted in the vertical and horizontal directions can be displayed on the liquid crystal panel 102. According to the digital still camera of the third embodiment, even when the display section 10 is directed to the opposite side of the lens 2a, the same object image as that viewed from the photographer side can be displayed on the display section 10. For example, when the display section 10 is directed to the same side as that of the lens 2a to display the photographer himself/herself, a mirror image can be displayed without inverting the image in the vertical direction. At this time, complex control need not be performed to read out image data, and the arrangement of the multiplexer 104d for displaying a mirror image inverted in the vertical direction can be simplified.

Fourth Embodiment

Figure 13:
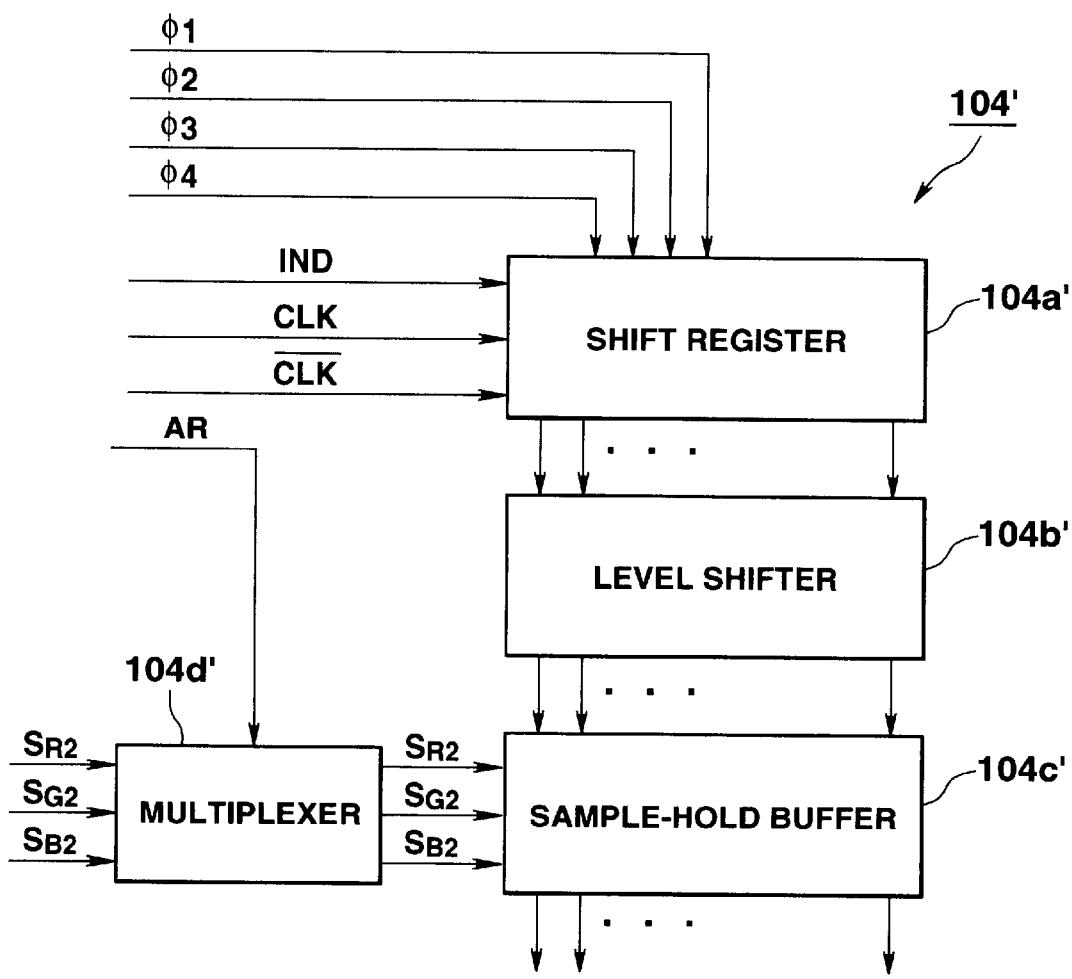
FIG. 13 is a block diagram showing the arrangement of a drain driver according to the fourth embodiment of the present invention.

The circuit arrangement of a digital still camera of the fourth embodiment is different from that of the first or third arrangement in a drain driver 104. The drain driver 104' is shown in FIG. 13. Accordingly, signals φ1, φ2, φ3 and φ4 are added to a control signal group DCNT supplied from a liquid crystal controller 101 to the drain driver 104'.

Figure 14:
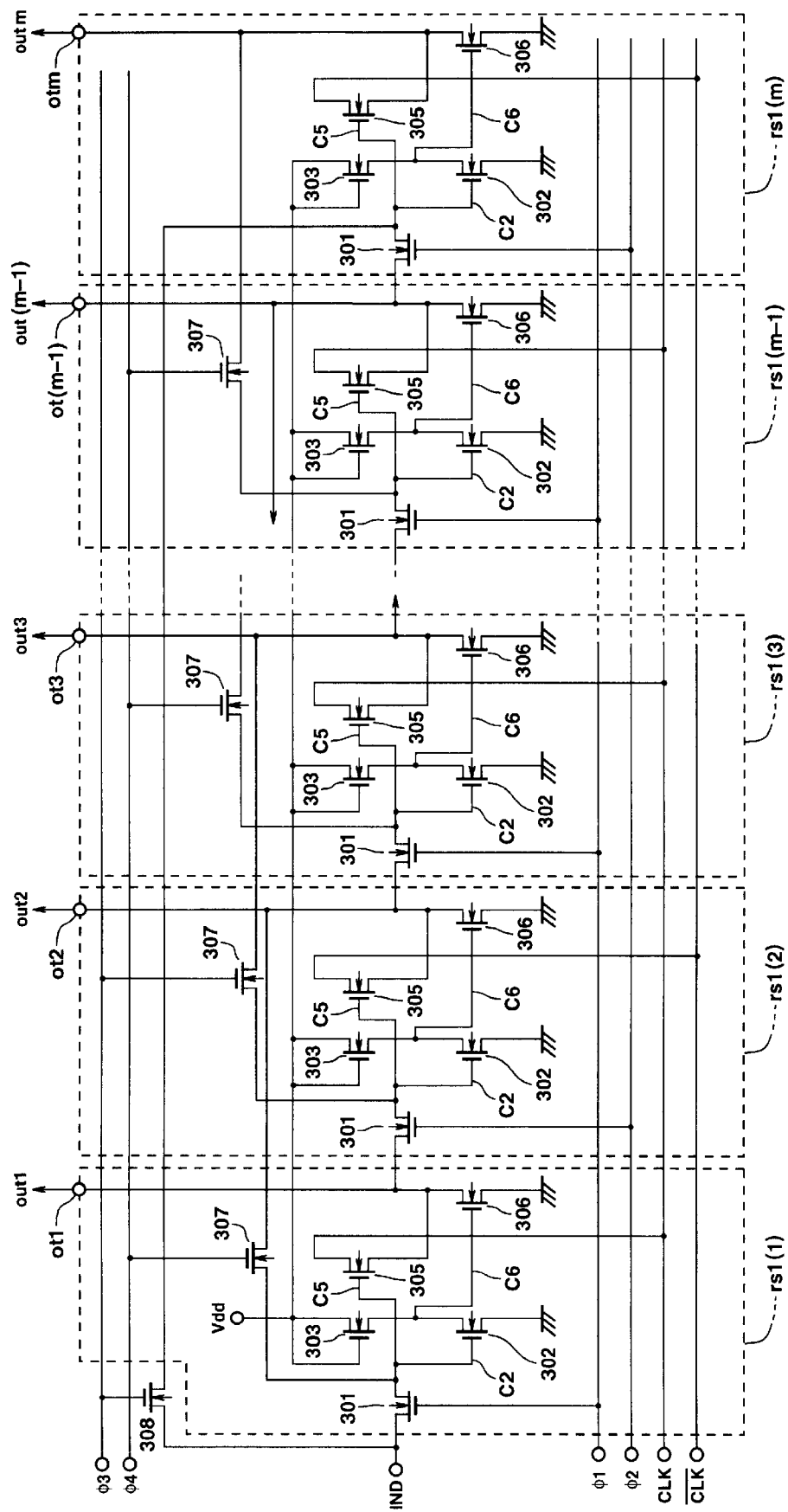
FIG. 14 is a circuit diagram showing a shift register according to the fourth embodiment of the present invention.

A shift register 104a' of the fourth embodiment has m stages, as shown in FIG. 14. Each stage rsl(i) (i=1, 2, ..., m) has substantially the same arrangement as that of the gate driver 103 in FIG. 8.

The digital still camera according to the fourth embodiment has, in a key input section 12, a key for switching the selection direction of gate lines GL1 to GLn by a gate driver 103 and a key for setting the selection direction of drain lines DL1 to DLm by the drain driver 104'.

The operation of the digital still camera of the fourth embodiment will be described below.

The digital still camera of the fourth embodiment is different from that of the third embodiment only in the operation of the shift register 104a'. A clock signal CLK and an inverted clock signal ⌈CLK supplied from the liquid crystal controller 101 are sequentially received in the forward direction (from out1 to outm) or reverse direction (from outm to out1) in accordance with setting.

The forward-direction operation of the shift register 104a' of the fourth embodiment will be described first with reference to the timing chart of FIG. 15.

Figure 15:
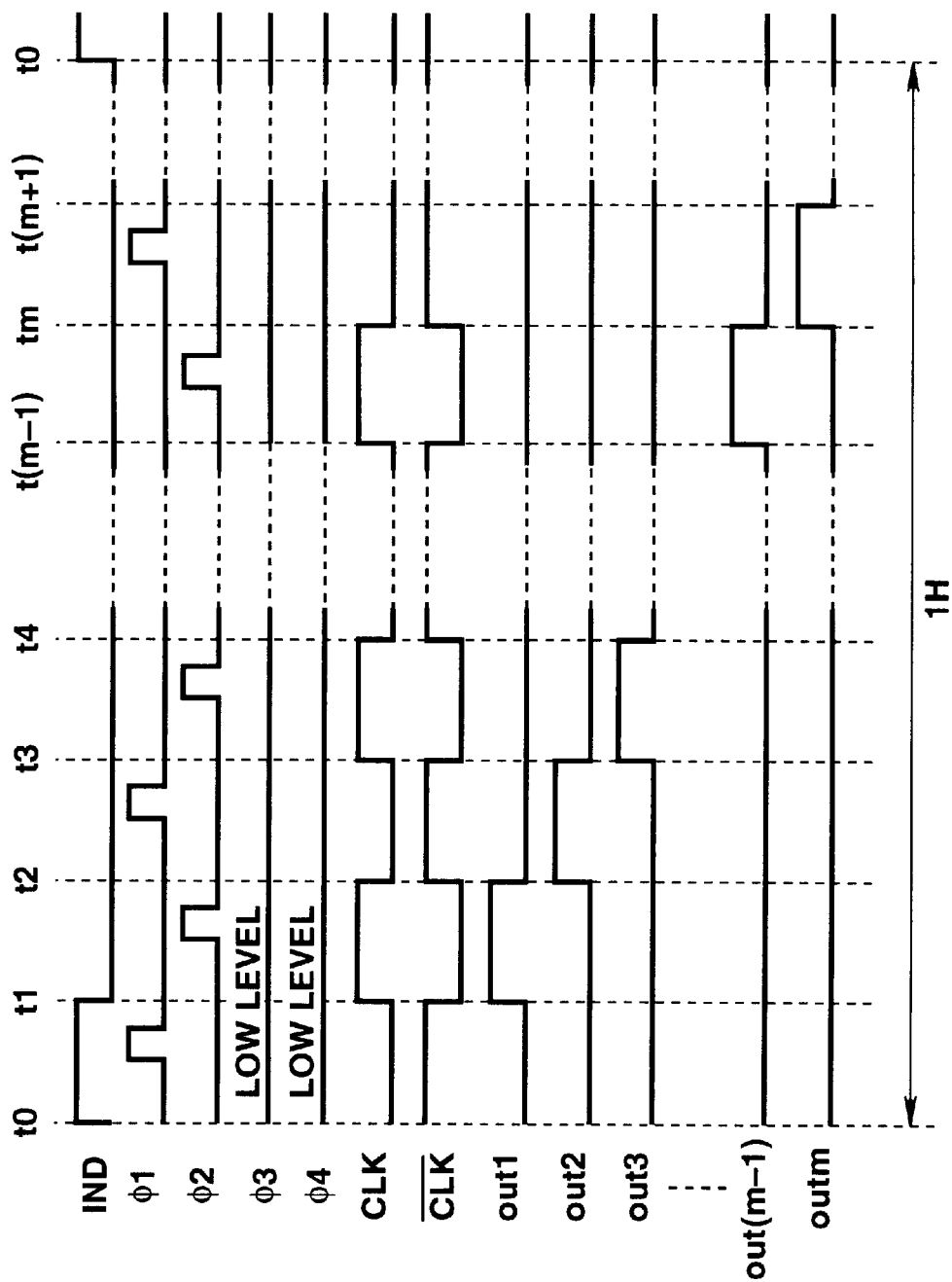
FIG. 15 is a timing chart showing the forward-direction operation of the shift register of the drain driver according to the fourth embodiment of the present invention.

As shown in FIG. 15, the signals φ3 and φ4 are always at low level. For this reason, transistors 307 and 308 are always OFF. In this case, the operation of the shift register 104a' is substantially the same as the forward-direction operation of the gate driver 103 of the third embodiment when the signals (Φ1, Φ2, CK1, and ⌈CK1 and start signal IN described in association with the gate driver 103 of the third embodiment are replaced with the signals φ1, φ2, CLK1, and ⌈CLK1 and start signal IND of the drain driver 104', respectively, and one vertical period 1V in FIG. 6 is replaced with one horizontal period 1H. That is, drive by the gate driver 103 in FIG. 6 in one vertical period 1V corresponds to drive by the shift register 104a' in one horizontal period 1H. Since transistors 301 to 308 in the shift register 104a' are driven at a higher frequency than in the gate driver 103, they preferably have semiconductor layers formed from polysilicon.

The reverse-direction operation of the shift register 104a' of the fourth embodiment will be described next with reference to the timing chart of FIG. 16.

Figure 16:
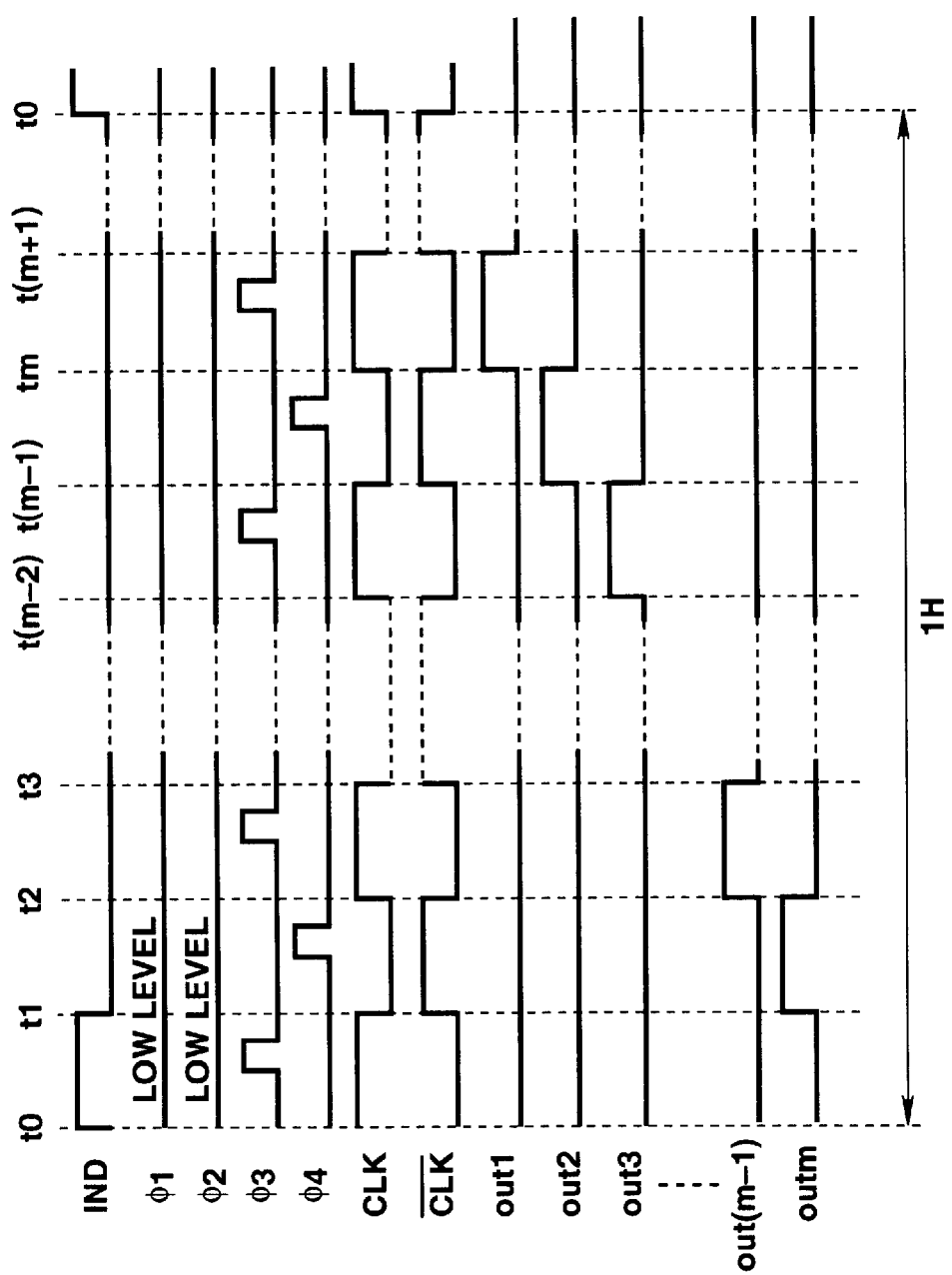
FIG. 16 is a timing chart showing the reverse-direction operation of the shift register of the drain driver according to the fourth embodiment of the present invention.

As shown in FIG. 16, the signals φ1 and φ2 are always at low level. For this reason, the transistors 307 and 308 are always OFF. In this case, the operation of the shift register 104a' is substantially the same as the reverse-direction operation of the gate driver 103 of the third embodiment when the signals Φ3, Φ4, CK1, and ⌈CK1 and start signal IN described in the third embodiment are replaced with the signals φ3, φ4, CLK1, and ⌈CLK1 and start signal IND, respectively, and one vertical period is replaced with one frame period as in the forward-direction operation.

The operation of the digital still camera of the third embodiment will be described below using a specific example. In this case, a mode setting key 12a is set in the photographing mode, and photographing is executed in the state shown in FIG. 12A of the third embodiment. At this time, display signals similar to those in FIG. 12B of the third embodiment are supplied to a display section 10.

A case wherein the user operates keys 12a, 12b, 12c, and 12d of the key input section 12 to set the scanning direction of the gate lines GL1 to GLn by the gate driver 103 in the forward direction, and the scanning direction of the drain lines DL1 to DLm by the drain driver 104' in the forward direction will be described.

Figure 17A:
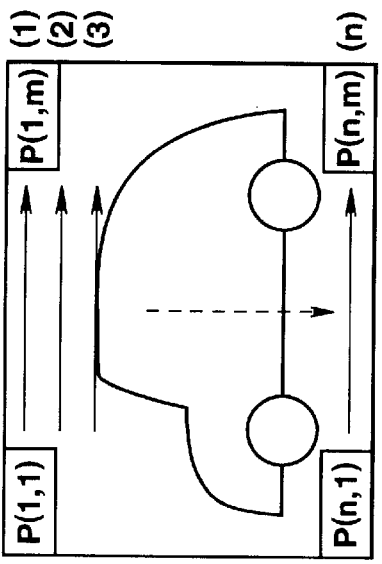

In this case, the operations of the gate driver 103 and drain driver 104' are substantially the same as those in FIG. 12B of the third embodiment, and an image shown in FIG. 17A is displayed on a liquid crystal panel 102.

Figure 17B:
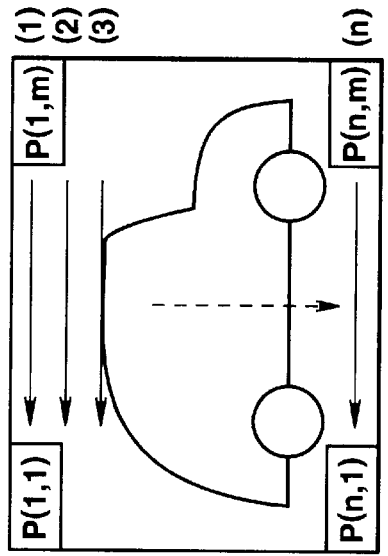
Figure 17C:
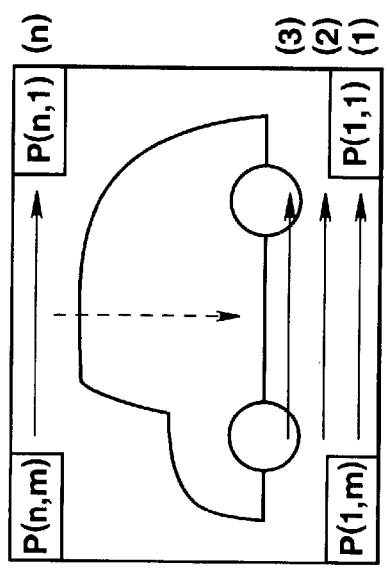
Figure 17D:
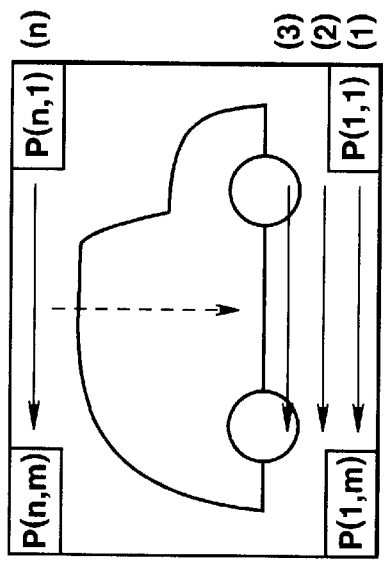

When a lens 2a of a lens unit 2 is set on the opposite side of the display section 10 of a camera body 1, and the user operates the keys 12a, 12b, 12c, and 12d of the key input section 12 to set the scanning direction of the gate lines GL1 to GLn by the gate driver 103 in the reverse direction, and the scanning direction of the drain lines DL1 to DLm by the drain driver 104' in the forward direction, substantially the same image as in FIG. 12B of the third embodiment is displayed, as shown in FIG. 17D. When the lens 2a of the lens unit 2 is pivoted to the same side as that of the display section 10 of the camera body 1, an image inverted along the vertical direction of FIG. 12B is displayed.

A case wherein the lens 2a of the lens unit 2 is set on the opposite side of the display section 10 of the camera body 1, and the user operates the keys 12a, 12b, 12c, and 12d of the key input section 12 to set the scanning direction of the gate lines GL1 to GLn by the gate driver 103 in the forward direction, and the scanning direction of the drain lines DL1 to DLm by the drain driver 104' in the reverse direction will be described next.

In this case, analog RGB signals SR2, SG2, and SB2 supplied from the liquid crystal controller 101 are received from the right to the left, as indicated by arrows in FIG. 17B. A multiplexer 104d' outputs the received analog RGB signals SR2, SG2, and SB2 in the forward direction, as in FIG. 17A. Since the shift register 104a' sequentially outputs a sampling signal to the drain lines in the order from DLm to DL1, a sample-hold buffer 104c' receives the analog RGB signals SR2, SG2, and SB2 in the order from DLm to DL1 and supplies the signals to the drain lines DL1 to DLm every horizontal period. On the other hand, the gate driver 103 sequentially selects the gate lines GL1, GL2, ..., GLn in the order named, as shown in FIG. 17B, in accordance with a control signal group GCNT from the liquid crystal controller 101. With this operation, the liquid crystal panel 102 is driven to display an image horizontally symmetric with respect to the photographed image, as shown in FIG. 17B. That is, the photographer can see the same image as the mirror image viewed from the object side.

A case wherein the lens 2a of the lens unit 2 is set on the same side as that of the display section 10 of the camera body 1, and the user operates the keys 12a, 12b, 12c, and 12d of the key input section 12 to set the scanning direction of the gate lines GL1 to GLn by the gate driver 103 in the reverse direction, and the scanning direction of the drain lines DL1 to DLm by the drain driver 104' in the reverse direction will be described next.

In this case, the analog RGB signals SR2, SG2, and SB2 supplied from a level shifter 113 are received while being scanned along solid arrows in FIG. 17C. The drain driver 104' supplies the received analog RGB signals SR2, SG2, and SB2 to the drain lines DLm to DL1 every horizontal period 1H. On the other hand, the gate driver 103 sequentially selects the gate lines GLn, ..., GL2, GL1 in the order named, as shown in FIG. 17C, in accordance with the control signal group GCNT from the liquid crystal controller 101. With this operation, the liquid crystal panel 102 is driven to display a photographed image as shown in FIG. 17C. That is, the same image as that viewed from the photographer side can be seen from the object side.

As described above, in the digital still camera according to the fourth embodiment, by controlling the signals Φ1 to Φ4 supplied from the liquid crystal controller 101 to the gate driver 103, the scanning order of the gate lines GL1 to GLn can be set in either forward or reverse direction. In addition, by controlling the signals φ1 to φ4 supplied to the drain driver 104', the direction in which the shift register 104a' of the drain driver 104' receives the analog RGB signals SR2, SG2, and SB2 can be set in either forward or reverse direction. Only with this arrangement, the direction of an image to be displayed on the liquid crystal panel 102 can be arbitrarily set. Hence, according to the digital still camera of the fourth embodiment, complex control need not be performed to read out image data from a frame memory, and the arrangement of the liquid crystal controller 101 for displaying an image in an arbitrary direction can be simplified.

Fifth Embodiment

A digital still camera according to the fifth embodiment has substantially the same outer appearance and circuit arrangement as in the first embodiment except the arrangement of a gate driver 103.

Figure 18:
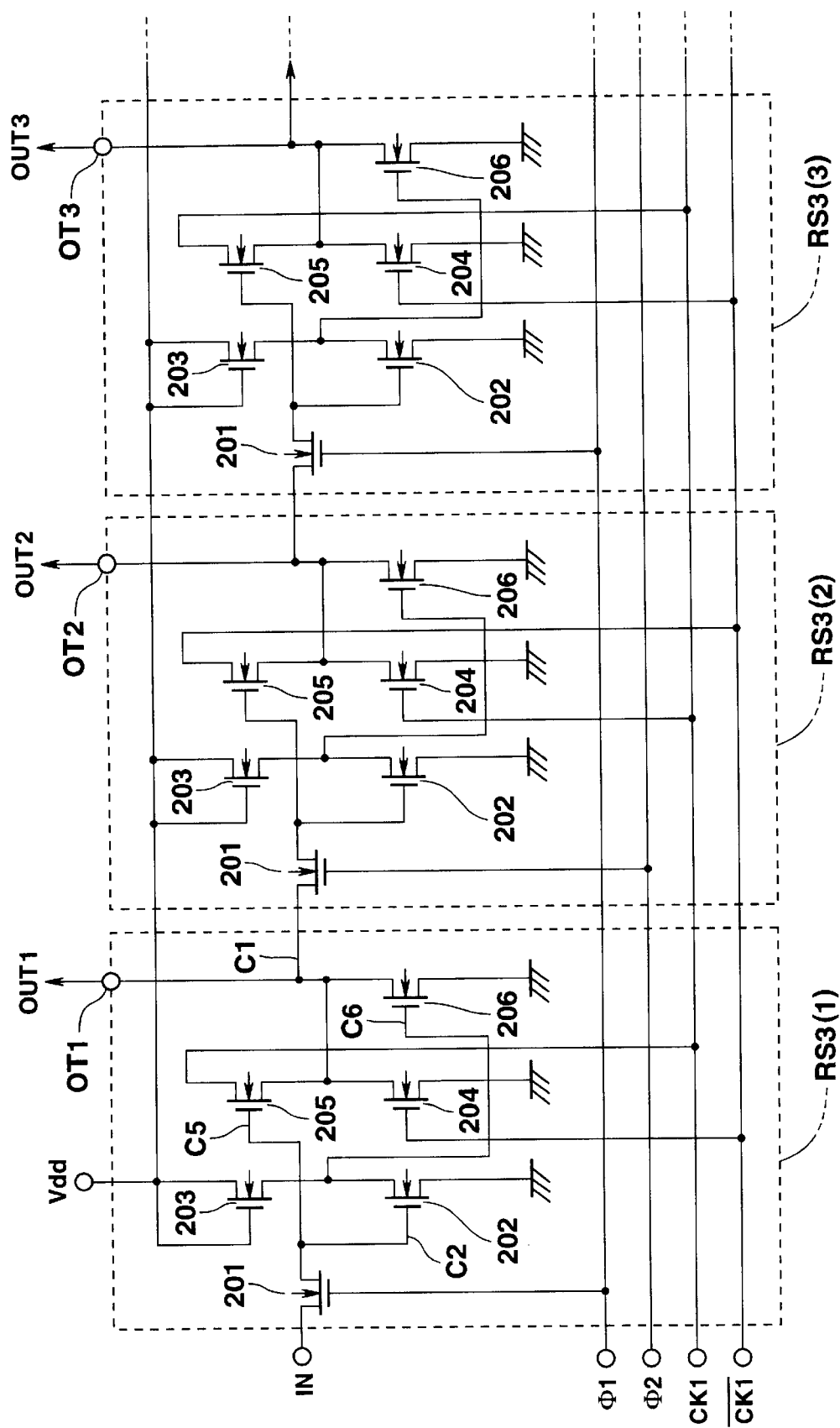
FIG. 18 is a circuit diagram showing a gate driver according to the fifth embodiment of the present invention.

FIG. 18 is a circuit diagram of the gate driver 103 of the fifth embodiment.

Each stage RS3(i) (i=1, 2, ..., n; n is a positive integer) of the gate driver 103 has six transistors 201 to 206. Signals applied to the gate of the transistor 201, the gate of the transistor 204, and the drain of the transistor 205 in an odd-numbered stage RS3(i) (i=1, 3, ...) of the gate driver 103 are different from those in an even-numbered stage RS3(i) (i=2, 4, ...). More specifically, in an odd-numbered stage, a signal Φ1 is applied to the gate of the transistor 201, and a signal ⌈CK1 is applied to the gate of the transistor 204, and a signal CK1 is applied to the drain of the transistor 205. In an even-numbered stage, a signal Φ2 is applied to the gate of the transistor 201, the signal CK1 is applied to the gate of the transistor 204, and the signal ⌈CK1 is applied to the drain of the transistor 205.

The signal Φ1 rises when signal CK1 is at low level. The signal Φ2 rises when the signal CK1 is at high level. The signals Φ1 and Φ2 alternately rise and are applied to the gate of the transistor 201 of each odd-numbered stage and the gate of the transistor 201 of each even-numbered stage, respectively.

The arrangement and function of an odd-numbered stage RS3(i) using the first stage RS3(1) as an example will be described below.

In the first stage RS3(1) of the shift register, the signal Φ1 is applied to the gate of the transistor 201, and a start signal IN is applied to the drain. A current flowing between the drain and source of the transistor 201 when the gate is ON charges line capacitances C2 and C5 formed on lines between the source of the transistor 201 and the gates of the transistors 202 and 205, respectively. The line capacitances C2 and C5 are kept at high level after the transistor 201 is turned off and until the signal Φ1 is applied to turn on the transistor 201 again.

A reference voltage Vdd is applied to the gate and drain of the transistor 203, so the transistor 203 is always ON. When the line capacitance C2 is not charged, and the transistor 202 is OFF, a line capacitance C6 formed on a line to the transistor 206 is charged. When the line capacitance C2 is charged, the transistor 202 is turned on, and a through current flows between the drain and source of the transistor 202. Since the transistors 202 and 203 have an EE structure, no perfect OFF resistance is formed on the transistor 203.

For this reason, the line capacitance C6 may not be completely discharged but has a voltage sufficiently lower than a threshold gate voltage Vth of the transistor 206.

The signal CK1 is supplied to the drain of the transistor 205. When the signal CK1 is at high level, the signal ⌈CLK is at low level, and the transistor 204 is OFF. For this reason, a line capacitance C1 formed on a line to the drain of the transistor 201 of the second stage is charged. Hence, an output signal OUT1 of high level is output from an output terminal OT1 of the first stage RS3(1).

Since the signal Φ1 is at low level, and the transistor 201 is OFF, the line capacitance C5 is kept charged by the start signal IN. When the transistor 205 outputs the signal to the output terminal OT1, the accumulation capacitance between the gate and source of the transistor 205 increases. Along with this increase, the gate voltage of the transistor 205 rises until the current flowing between the drain and source may be saturated. As the gate voltage of the transistor 205 rises, the potential of the output signal OUT1 rises, and the transistor 205 obtains a perfect ON resistance. Hence, the level of the signal CK1 is directly output as the level of the output signal OUT1 with little attenuation. While the output signal OUT1 is being output, the signal Φ2 is applied to the gate of the transistor 201 of the next stage to charge the line capacitances C2 and C5 of the next stage.

When the signal CK1 changes from high level to low level, the signal ⌈CK1 goes high to turn on the gate of the transistor 204. With this operation, the line capacitance C1 between the stage and the next stage is discharged sufficiently, and the output signal OUT1 from the first stage is grounded. More specifically, in the first embodiment, the signal CK1 goes low to set the output signal OUT1 at low level. In the fifth embodiment, additionally, the signal ⌈CK1 output to the gate of the transistor 204 goes high to forcibly set the output signal OUT1 at low level.

The transistors 204 and 205 do not have an EE structure. When the output signal OUT1 is at high level, the transistor 205 can obtain a perfect ON resistance, and the transistor 204 can have an almost perfect OFF resistance. For this reason, the signal CK1 of high level can be directly output as the output signal OUT1.

The arrangement of an even-numbered stage RS3(i) is substantially the same as that of an odd-numbered stage rs(1) except that the signals Φ1, CK1, and ⌈CK1 are replaced with the signals Φ2, ⌈CK1, and CK1, respectively. In the stages rs(i) (both even- and odd-numbered stages) from the second stage, the output signals OUT1 to OUT(n−1) from the preceding stages are supplied to the transistors 201 instead of the start signal IN.

The line capacitances C2 and C5 are discharged through the transistor 201 of the stage and the transistor 206 of the preceding stage when the signal Φ1 (in an odd-numbered stage) or Φ2 (in an even-numbered stage) goes high again. The discharged line capacitances C2 and C5 of each stage RS(i) are not charged again unless the signal Φ1 or Φ2 goes high in the same horizontal period in the next vertical period. Since the transistor 206 in the preceding stage is kept ON during the transistor 201 in the stage is turned on again by the signal Φ1 or Φ2 with the second high level, the line capacitance C1 between the stage and the preceding stage is kept low level state even when the signal CK1 or ⌈CK1 goes high, and the output signals OUT1, OUT2, ... output from the output terminals OT1, OT2, ..., respectively, go high one time in one vertical period 1V.

The operation of the gate driver 103 of the fifth embodiment will be described below.

The digital still camera of the fifth embodiment is different from that of the first embodiment only in the operation of the gate driver 103. As a consequence, the timing chart of input/output signals to/from the gate driver 103 is the same as that shown in FIG. 6 of the first embodiment.

From time T0 to T1, the start signal IN of high level is supplied from a liquid crystal controller 101 to the drain of the transistor 201 of the first stage. Next, for a predetermined period between times T0 and T1, the signal Φ1 rises to turn on the transistors 201 of the odd-numbered stages. The line capacitances C2 and C5 of the first stage are charged, and the signal goes high.

At this time, the potential at the gate of the transistor 202 of the first stage goes high to turn on the transistor 202 of the first stage. When the transistor 202 of the first stage is OFF, the signal at the line capacitance C6 is set at high level by the reference voltage Vdd supplied through the transistor 203 of the first stage. When the transistor 202 of the first stage is turned on, the reference voltage Vdd supplied through the transistor 203 of the first stage is grounded. The line capacitance C6 of the first stage is discharged and the signal at the line capacitance C6 goes low to turn off the transistor 206 of the first stage.

In addition, the potential at the gate of the transistor 205 of the first stage goes high to turn on the transistor 205 of the first stage. This state wherein the signal at the line capacitances C2 and C5 of the first stage is at high level, and the signal at the line capacitance C6 is at low level continues until the signal Φ1 rises again between times T2 and T3 to discharge the line capacitances C2 and C5 through the transistor 201 of the first stage.

At time T1, the signal CK1 goes high, and simultaneously, the signal ⌈CK1 goes low. With this operation, the transistor 204 of the first stage is turned off, and the signal CK1 of high level is supplied to the drain of the transistor 205 of the first stage. Since the transistor 205 of the first stage is ON, the transistor 204 of the first stage is OFF, and the transistor 206 of the first stage is OFF, the output signal OUT1 of high level is output from the output terminal OT1 of the first stage and also supplied to the drain of the transistor 201 of the second stage. The output signal OUT1 is kept at high level until the signal ⌈CK1 goes high at time T2 to turn on the transistor 204 of the first stage. Assume that the signal CK1 of high level has a voltage VH. The gate voltage of the transistor 205 of the first stage is raised as the output signal OUT1 is boosted, and the drain current flowing to the transistor 205 of the first stage may be saturated. Hence, the output signal OUT1 rarely attenuates and has the voltage VH.

Even when the signal Φ1 rises between times T0 and T1, the line capacitances C2 and C5 of odd-numbered stages from the third stage are not charged because no signals of high level are supplied to the drains of the transistors 201 of the odd-numbered stages from the third stage. Hence, in the odd-numbered stages from the third stage, the output signals OUT3, OUT5, . . . are kept at low level.

Next, for a predetermined period between times T1 and T2, the signal Φ2 rises to turn on the transistors 201 of the even-numbered stages. With this operation, the line capacitances C2 and C5 of the second stage are charged, and the signal goes high.

At this time, the potential at the gate of the transistor 202 of the second stage goes high to turn on the transistor 202 of the second stage. When the transistor 202 of the second stage is OFF, the signal at the line capacitance C6 is set at high level by the reference voltage Vdd supplied through the transistor 203 of the second stage. When the transistor 202 of the second stage is turned on, the reference voltage Vdd supplied through the transistor 203 of the second stage is grounded. The line capacitance C6 of the second stage is discharged and the signal at the line capacitance C6 goes low to turn off the transistor 206 of the second stage.

Simultaneously, the potential at the gate of the transistor 205 of the second stage goes high to turn on the transistor 205 of the second stage. This state wherein the signal at the line capacitances C2 and C5 of the second stage is at high level, and the signal at the line capacitance C6 is at low level continues until the signal Φ2 rises between times T3 and T4 to discharge the line capacitances C2 and C5 of the second stage through the transistor 201 of the second stage and the transistor 206 of the first stage.

At time T2, the signal CK1 goes low, and simultaneously, the signal ⌈CK1 goes high. With this operation, the transistor 204 of the second stage is turned off, and the signal ⌈CK1 of high level is supplied to the drain of the transistor 205 of the second stage. Since the transistor 205 of the second stage is ON, and the transistor 206 of the second stage is OFF, the output signal OUT2 of high level is output from the output terminal OT2 of the second stage and also supplied to the drain of the transistor 201 of the third stage. The output signal OUT2 is kept at high level until the signal CK1 goes high to turn on the transistor 204 of the second stage at time T3. Assume that the signal ⌈CK1 of high level has the voltage VH. The gate voltage of the transistor 205 of the second stage is raised as the output signal OUT2 is boosted, and the drain current flowing to the transistor 205 of the second stage may be saturated. Hence, the output signal OUT2 rarely attenuates and has the voltage VH.

Even when the signal Φ2 rises between times T1 and T2, the line capacitances C2 and C5 are not charged because no signals of high level are supplied to the drains of the transistors 201 of the even-numbered stages from the fourth stage. Hence, in the even-numbered stages from the fourth stage, the output signals OUT4, OUT6, . . . are kept at low level.

In a similar manner, one of the output signal OUT1 from the output terminal OT1 of the first stage to the output signal OUTn from the output terminal OTn of the nth stage sequentially goes high and is output until time T(n+1). The gate lines GL1 to GLn are selected in correspondence with the output signals OUT1 to OUTn of high level. At time T0 of the next vertical period, the start signal IN is supplied from the liquid crystal controller 101, and the same processing as described above is repeated.

As described above, according to this embodiment, the transistors 204 and 205 in each stage RS3(i) of the gate driver 103 of the display section 10, which are at a position immediately before the next stage, do not have the EE structure. For this reason, the OFF resistance of the transistor 205 and ON resistance of the transistor 204 can be almost completely attained.

In addition, since the line capacitance C5 is held, the accumulation capacitance between the gate and source of the transistor 205 increases as the signal is output to the output terminal TO. In accordance with this increase, the gate voltage of the transistor 205 is increased until the current flowing between the drain and source may be saturated. As the gate voltage of the transistor 205 increases, the potential of the output signal OUT rises, and the transistor 205 obtains perfect ON resistance. Hence, the signal CK2 of high level can be directly output as the output signal OUT. Since the gate voltage output to the gate lines GL1 to GLn can be output to the TFTs 102*a* without any attenuation, display errors based on changes in drain currents of the TFTs 102*a* due to changes in gate voltages of the TFTs 102*a* can be prevented.

In the fifth embodiment, a signal CK2 may be output in place of the signal ⌈CK1 shown in FIG. 18 to drive the gate driver with the waveform as shown in FIG. 7, as in the second embodiment.

Sixth Embodiment

A digital still camera according to the sixth embodiment has substantially the same outer appearance and circuit arrangement as in the first embodiment except the arrangement of a gate driver 103. Accordingly, signals CK2 and ⌈CK2 are added to a control signal group GCNT supplied from a liquid crystal controller 101 to the gate,driver 103.

Figure 19:
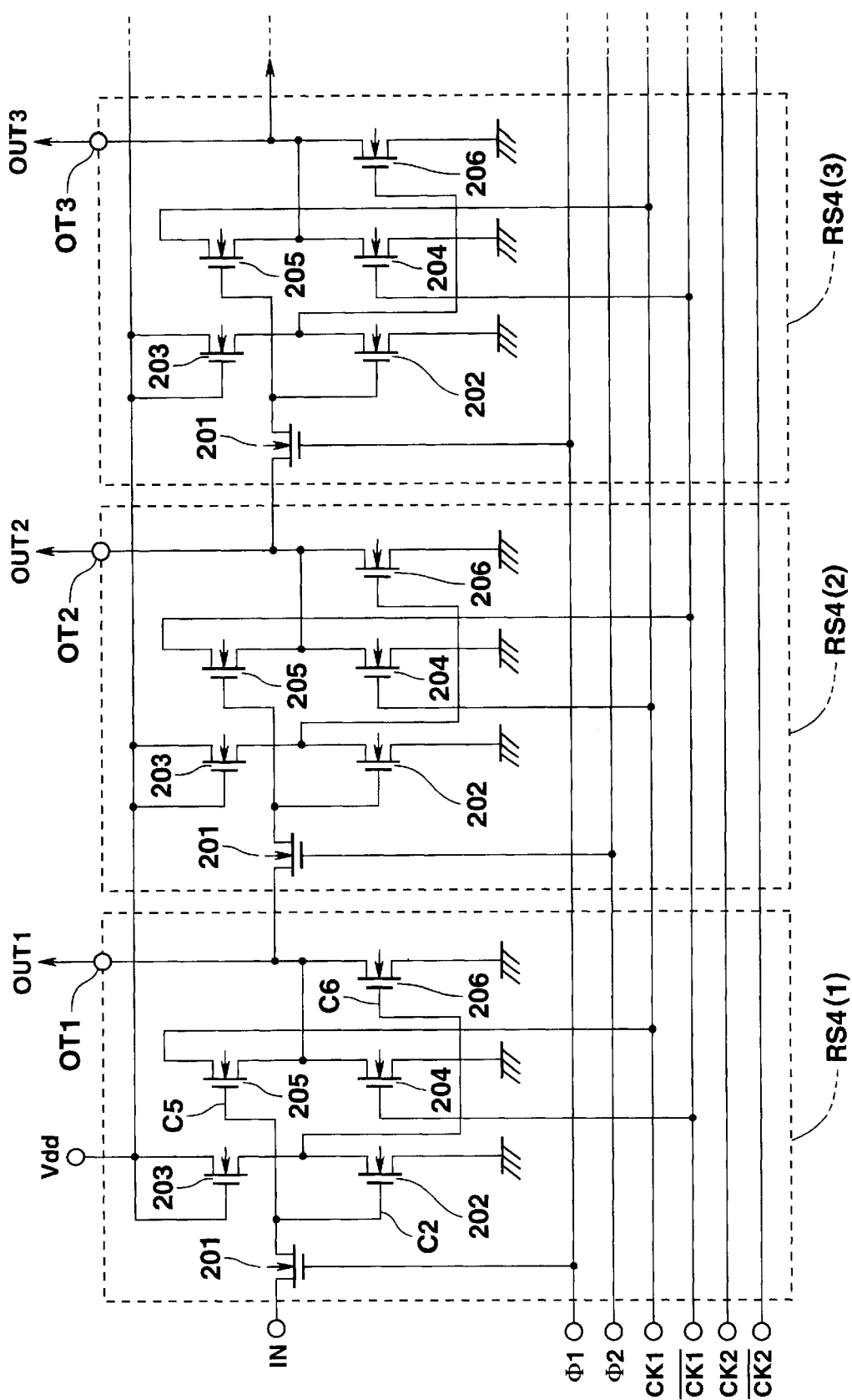
FIG. 19 is a circuit diagram showing a gate driver according to the sixth embodiment of the present invention.

FIG. 19 is a circuit diagram of the gate driver 103 of the digital still camera according to the sixth embodiment. Each stage RS4(i) (i=1, 2, . . . , n; n is a positive integer) of the gate driver 103 has six transistors 201 to 206.

In this embodiment, the gate driver 103 is different from that of the fifth embodiment in an even-numbered stage RS4(i) (i=2, 4, . . . , n−1 or n). The signal ⌈CK2 is supplied to the gate of the transistor 204 in place of the signal CK1, and the signal CK2 is supplied to the drain of the transistor 205 in place of the signal ⌈CK1.

The operation of the digital still camera according to the sixth embodiment will be described below.

Figure 20:
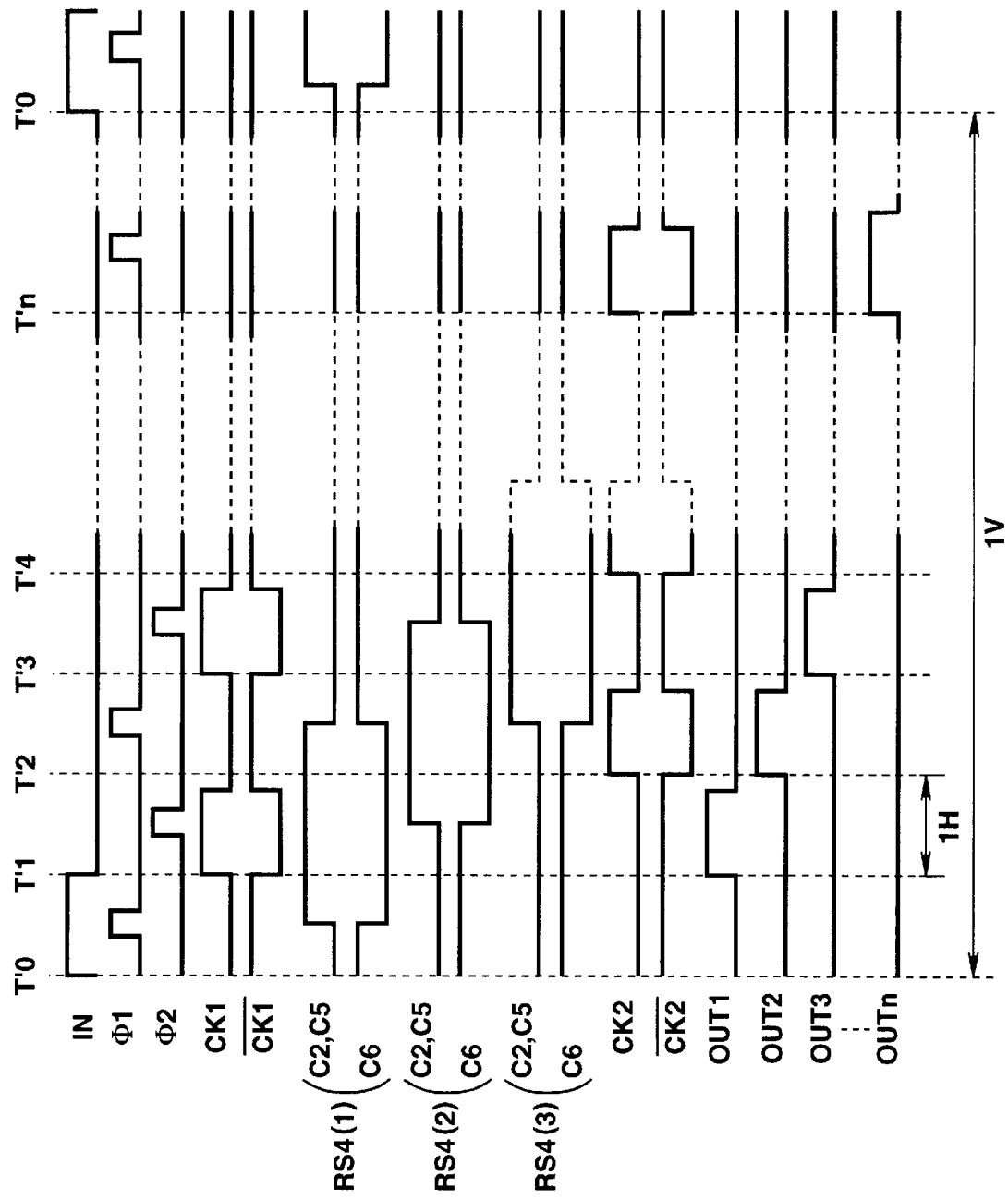
FIG. 20 is a timing chart showing the operation of the gate driver according to the sixth embodiment of the present invention.

The digital still camera of this embodiment is different from that of the first embodiment only in the operation of the gate driver 103 shown in FIG. 19. The operation of the gate driver 103 of the sixth embodiment will be described with reference to the timing chart of FIG. 20.

This operation is almost the same as that of the first embodiment described with reference to the timing chart of FIG. 6. Between times T′1 and T′2, the period when the signal CK1 is at high level is shorter than one horizontal period 1H. An output signal OUT1 from the first stage also goes high only while the signal CK1 is at high level. This also applies to odd-numbered stages from the third stage.

In the second stage, the signal CK2 is supplied to the drain of the transistor 205, and the signal ⌈CK2 is supplied to the gate of the transistor 204. The period when the signal CK1 is at high level is shorter than one horizontal period 1H. In the second stage, an output signal OUT2 goes high while the signal CK2 is at high level between times T′2 and T′3. This also applies to even-numbered stages RS4(i) from the fourth stage.

As described above, in the digital still camera of the sixth embodiment, the period when the signals are supplied to the gates of the transistors 204 and the drains of the transistors 205 of the odd- and even-numbered stages of the gate driver 103 is made shorter than one horizontal period 1H by using the signals CK1 and CK2 (and their inverted signals). When the period when the signal CK1 or CK2 is set at high level is changed, the selection period of gate lines GL1 to GLn by the gate driver 103 can be arbitrarily selected.

Seventh Embodiment

A digital still camera according to the seventh embodiment has substantially the same outer appearance and circuit arrangement as in the third embodiment except the arrangement of a gate driver 103.

Figure 21:
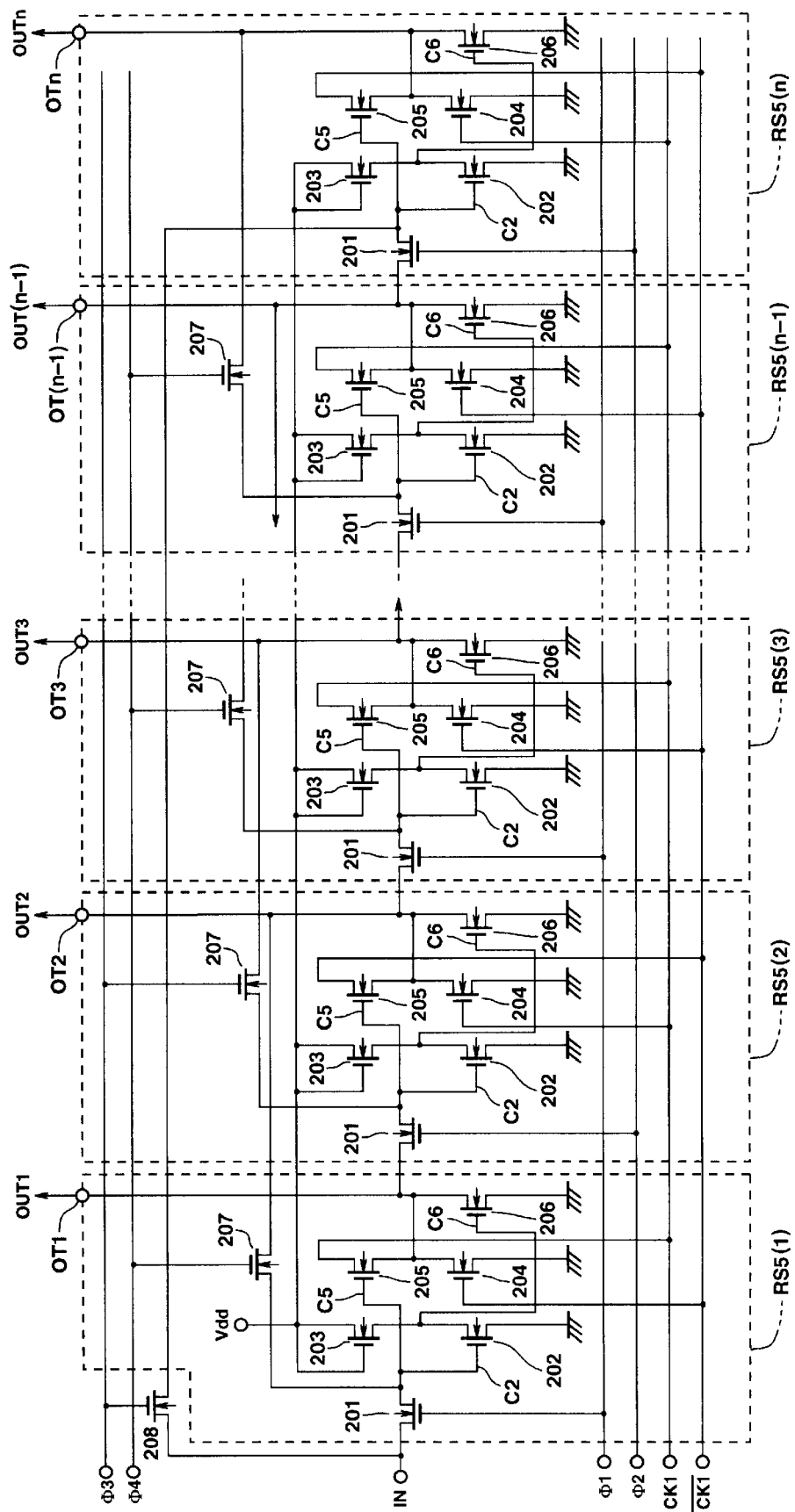
FIG. 21 is a circuit diagram showing a gate driver according to the seventh embodiment of the present invention.

FIG. 21 is a circuit diagram of the gate driver 103 of the digital still camera of the seventh embodiment.

Each stage of the gate driver 103 has the same arrangement as in the fifth embodiment (FIG. 18) added with a transistor 207. The gate driver 103 also has a transistor 208 formed independently of the stages.

The transistor 208 is turned on when a signal Φ3 is at high level to supply a start signal IN supplied from a liquid crystal controller 101 to line capacitances C2 and C5 of a final stage RS5(n). When a signal ⌈CK1 goes high, a signal OUTn at substantially the same level as that of the signal ⌈CK1 is output from the final stage RS5(n). When the signal OUTn is output, a signal Φ4 is output to turn on the transistor 207 of a stage RS5(n−1), so the signal OUTn charges line capacitances C2 and C5 of the preceding stage RS5(n−1). The signal Φ3 output from the liquid crystal controller 101 turns on the transistors 207 of even-numbered stages RS5 (2k) (k is an integer of 1 or more), so a signal OUT(2k+1) from the subsequent odd-numbered stage RS5(2k+1) charges the line capacitances C2 and C5 of the even-numbered stage RS5(2k). The signal Φ4 output from the liquid crystal controller 101 turns on the transistors 207 of odd-numbered stages RS5(2k−1) (k is an integer of 1 or more), so a signal OUT(2k) from the subsequent even-numbered stage RS5(2k) charges the line capacitances C2 and C5 of the odd-numbered stage RS5(2k−1).

When the final stage RS5(n) is an even-numbered stage, the liquid crystal controller 101 is set to invert or phase-shift a signal CK1 in a forward-direction operation and the signal CK1 in a reverse-direction operation (to be described later) with respect to the start signal IN, and invert or phase-shift the signal ⌈CK1 in the forward-direction operation and the signal ⌈CK1 in the reverse-direction operation. When the final stage RS5(n) is an odd-numbered stage, the liquid crystal controller 101 is set such that the signal CK1 in the forward-direction operation and the signal CK1 in the reverse-direction operation are in phase with respect to the start signal IN, and the signal ⌈CK1 in the forward-direction operation and the signal ⌈CK1 in the reverse-direction operation are in phase.

The operation of the digital still camera of the seventh embodiment will be described below. The operation of the gate driver 103 of the seventh embodiment is the same as that described in the third embodiment when "as in the first embodiment" is replaced with "as in the fifth embodiment". Except this, the description is the same as in the third embodiment.

As described above, in the digital still camera of the seventh embodiment, the scanning order of gate lines GL1 to GLn can be set to be in either forward or reverse direction by controlling the signals Φ1 to Φ4 supplied from the liquid crystal controller 101 to the gate driver 103. Only with this arrangement, a mirror image inverted in the vertical and horizontal directions can be displayed on a liquid crystal panel 102. According to the digital still camera of the seventh embodiment, even when a display section 10 is directed to the opposite side of a lens 2*a*, the same object image as that viewed from the photographer side can be displayed on the display section 10. For example, when the display section 10 is directed to the same side as that of the lens 2*a* to display the photographer himself/herself, a mirror image can be displayed without inverting the image in the vertical direction. At this time, complex control need not be performed to read out image data, and the arrangement of a multiplexer 104*d* for displaying a mirror image inverted in the vertical direction can be simplified.

Eighth Embodiment

A digital still camera according to the eighth embodiment has substantially the same outer appearance and circuit arrangement as in the fourth embodiment except the arrangement of a gate driver 103 and the arrangement of a shift register 104a' in a drain driver 104'.

Figure 22:
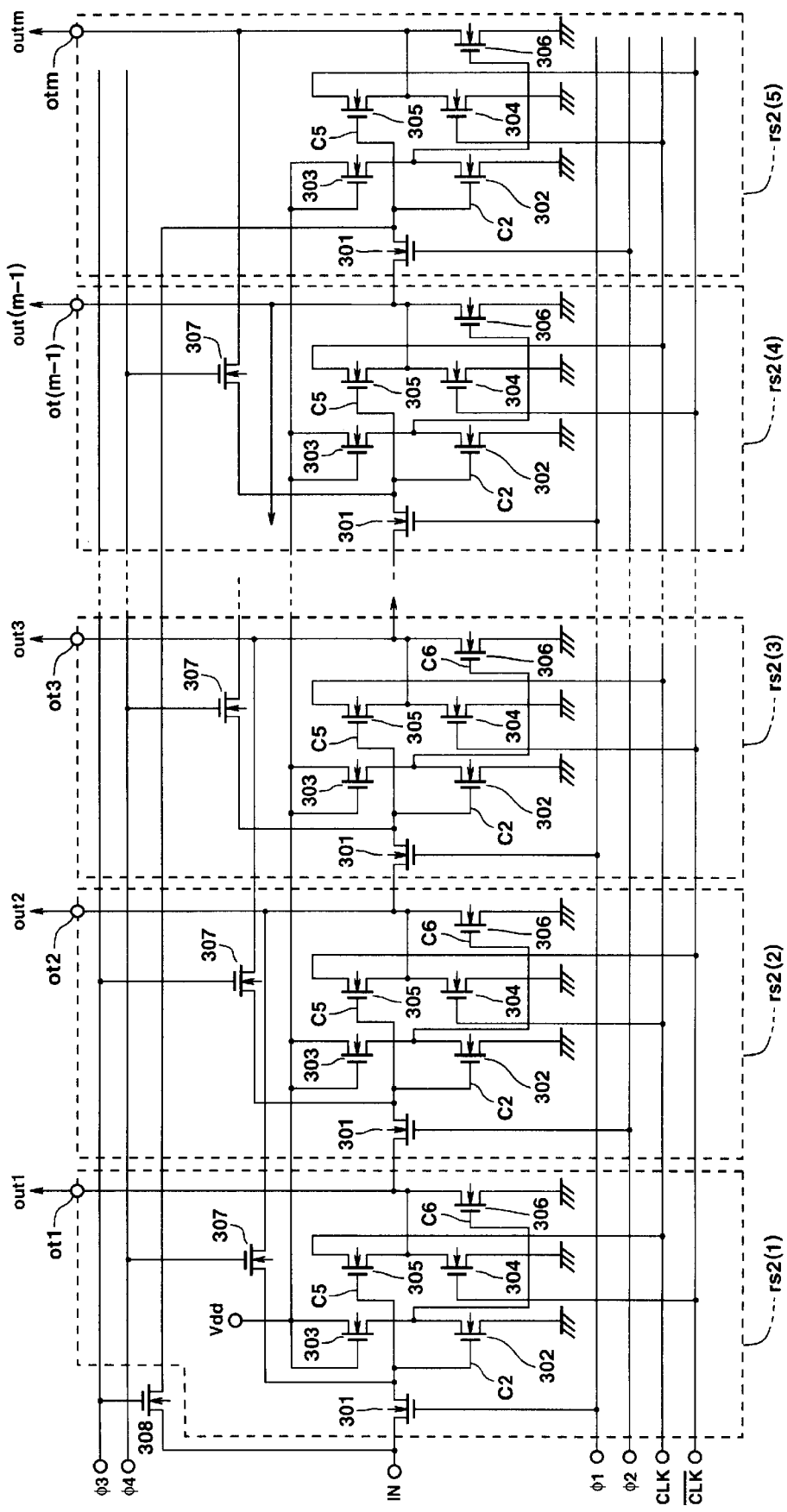
FIG. 22 is a circuit diagram showing a shift register according to the eighth embodiment of the present invention.

In the eighth embodiment, the circuit arrangement of the gate driver 103 is the same as in the seventh embodiment (FIG. 21). The shift register 104a' has m stages, as shown in FIG. 22. Each stage rs2(i) (i=1, 2, ..., m) has substantially the same arrangement as that of the gate driver 103 in FIG. 21.

The operation of the digital still camera of the eighth embodiment will be described below. In this embodiment, when signals Φ1, Φ2, CK1, ⌈CK1, and start signal IN are replaced with signals Φ1, Φ2, ck1, ⌈ck1. and start signal IND, respectively, one vertical period is replaced with one horizontal period, and one horizontal period is replaced with one vertical period, the operation is substantially the same as that of the gate driver 103 of the seventh embodiment in both the forward and reverse directions.

As described above, in the digital still camera according to the eighth embodiment, by controlling the signals Φ1 to Φ4 supplied from the liquid crystal controller 101 to the gate driver 103, the scanning order of gate lines GL1 to GLn can be set in either forward or reverse direction. In addition, by controlling the signals φ1 to φ4 supplied to the drain driver 104', the direction in which the shift register 104a' of the drain driver 104' receives the analog RGB signals SR2, SG2, and SB2 can be set in either forward or reverse direction. Only with this arrangement, the direction of an image to be displayed on the liquid crystal panel 102 can be arbitrarily set. Hence, according to the digital still camera of the fourth embodiment, complex control need not be performed to read out image data from a frame memory, and the arrangement of the liquid crystal controller 101 for displaying an image in an arbitrary direction can be simplified.

Modifications of the Embodiments

The present invention is not limited to the above first to eighth embodiments, and various changes and modifications can be made. Modifications of the first to eighth embodiments will be described below.

In the first to eighth embodiments, in each stage of the shift register 104a or 104a', of the gate driver 103 or drain driver 104 or 104', a load is generated by applying a voltage from the voltage source to the gate and drain of the transistor 203 or 303. Instead, a resistor may be used.

In the second or sixth embodiment, only the gate driver 103 has an arrangement different from that of the first or third embodiment, and the signals CK2 and ⌈CK2 are supplied from the liquid crystal controller 101. The shift register 104a of the drain driver 104 of the first, second, fifth, and sixth embodiments may have the arrangement in FIG. 14. In this case, the shift register 104a outputs the output signals out1 to outm in one horizontal period 1H. Even in the gate driver 103 or shift register of the drain driver 104 which operates in both the forward and reverse directions, as described in the third, fourth, seventh, or eighth embodiment, signals may be supplied at different timings between odd- and even-numbered stages, as in the second and fifth embodiments. In the present invention, one of the above-described combinations of the gate driver 103 and the shift register 104a of the drain driver 104 can be arbitrarily selected.

In the first to eighth embodiments, as elements constructing the gate driver 103 or shift register 104a or 104a' of the drain driver 104 or 104', n-channel MOSFETs are used. However, p-channel MOSFETs may be used by inverting the control signals. Alternatively, field effect transistors other than MOSFETs may be used.

In the first to eighth embodiments, the gate driver 103 (including the reverse direction in the third and fourth embodiments) sequentially selects the lines without performing interlaced scanning of the gate lines GL1 to GLn. When one frame is formed from two fields of even-numbered gate line scanning and odd-numbered gate line scanning, and interlaced scanning is to be performed in one field, the circuit shown in FIGS. 5, 8, 18, or 19 is formed in correspondence with each of the two fields, and the start signal is supplied to the circuit for each field to perform interfaced scanning.

In the first to eighth embodiments, as the display section 10 for displaying an image received by the CCD 21 or an image recorded in the recording memory 30, a liquid crystal display device is used. However, as the display section 10, another flat panel display device such as an organic/inorganic electroluminescence display device, a plasma display device, or a field emission display device can also be used. In any case, the gate driver and drain driver shown in the first to eighth embodiments can be used as driving circuits. The circuit shown in FIGS. 5, 8, 18, or 19 can be used as a shift register for another application purpose other than a driving circuit for a display device.

In the first to eighth embodiments, the present invention is applied to a digital still camera. However, the present invention can also be applied to a video camera using a liquid crystal display device as a viewfinder. In this case as well, when the gate driver described in the third or seventh embodiment is used, a mirror image can be displayed. When the gate driver and drain driver 104 described in the fourth or eighth embodiment are used, an image can be displayed by arbitrarily setting the vertical and horizontal directions of the image. The present invention may be applied to the display device of another apparatus (e.g., a portable terminal).

Figure 23:
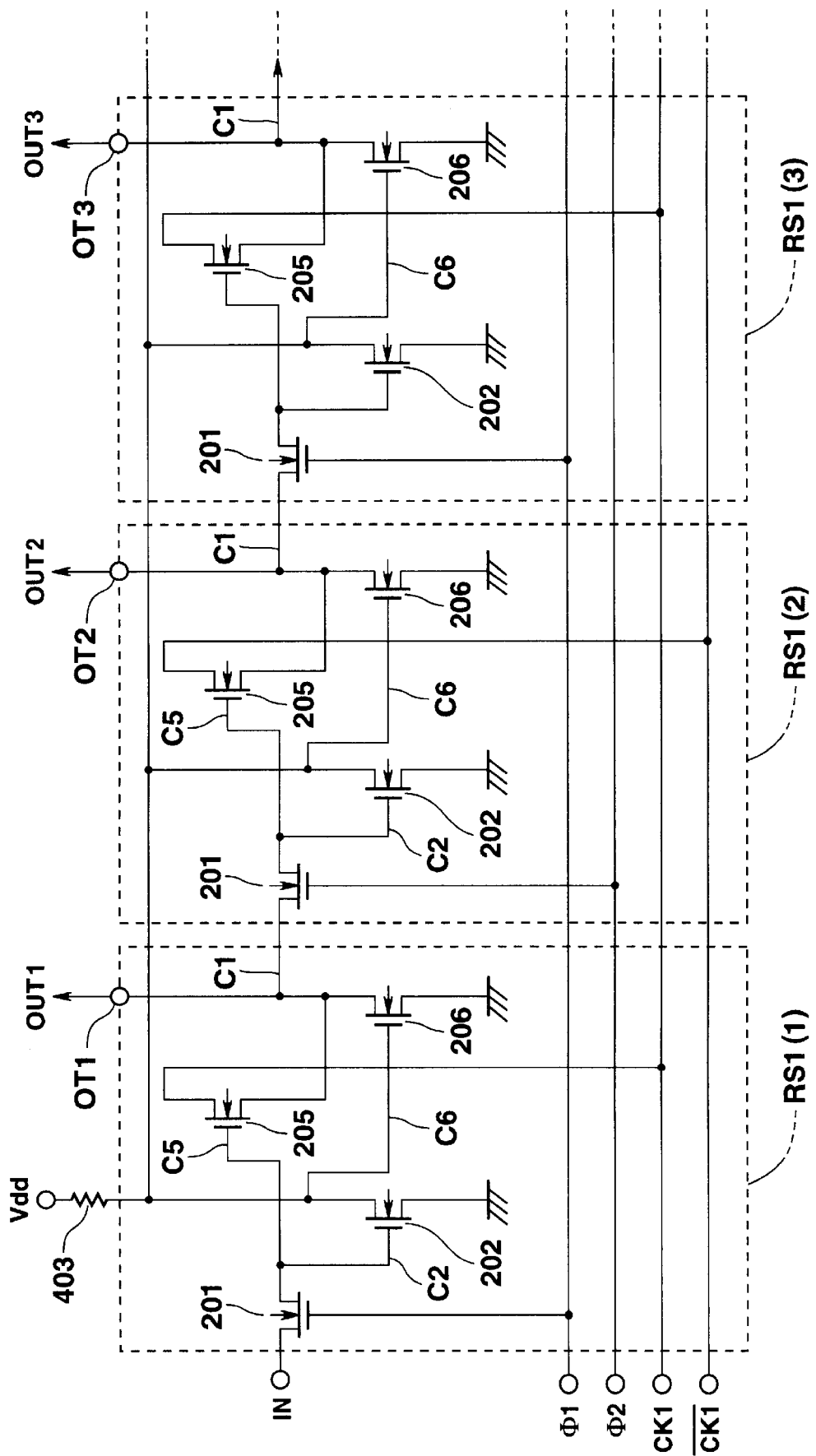
FIG. 23 is a circuit diagram showing a shift register of a modification of the present invention.
Figure 24:
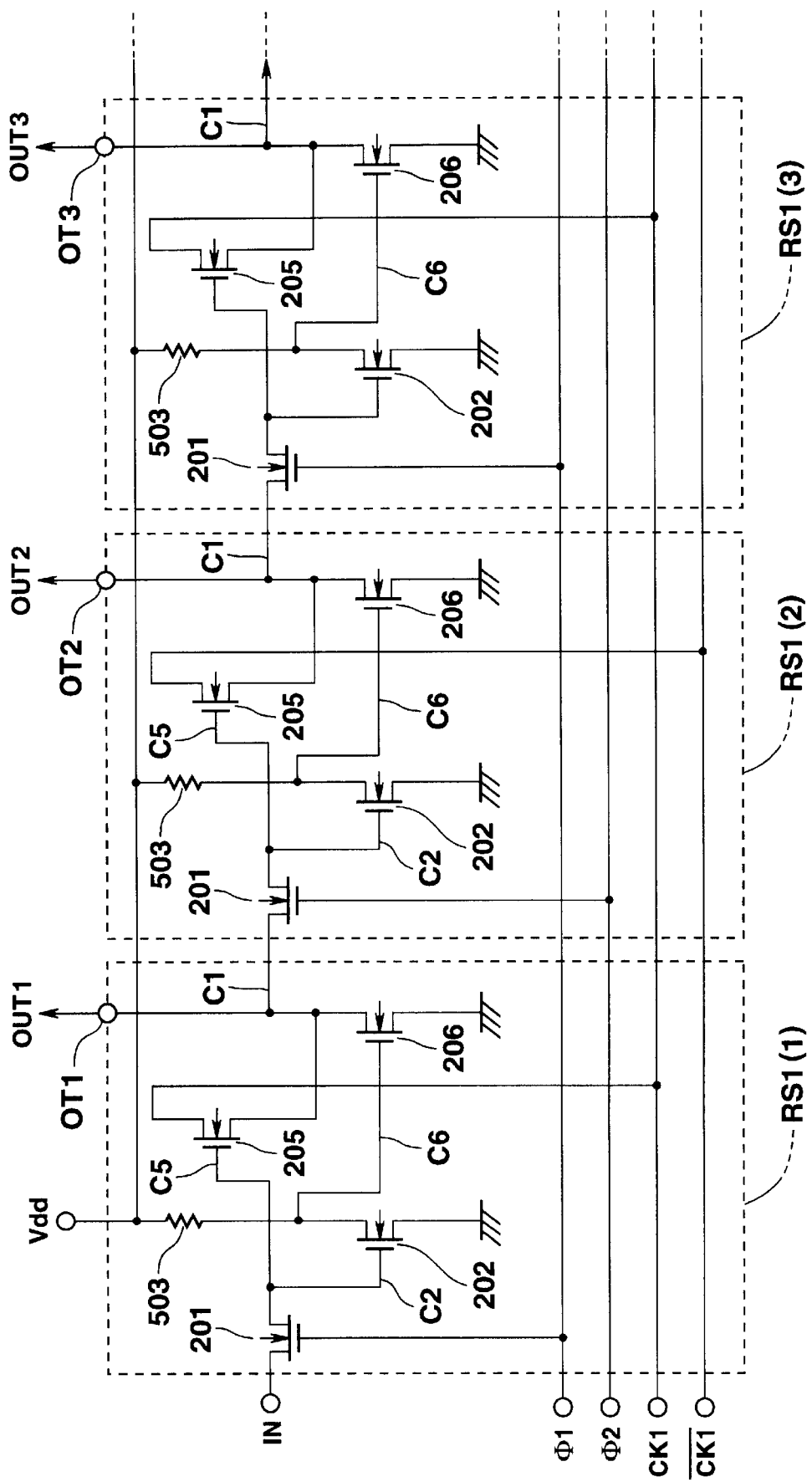
FIG. 24 is a circuit diagram showing a shift register of another modification of the present invention.

In the first to eighth embodiments, the transistor 203 or 303 is arranged in each stage. However, as shown in FIG. 23, one resistance element 403 may be connected in series to all the stages, in place of the transistor 203 or 303 of each stage. Alternatively, as shown in FIG. 24, a resistance element 503 other than a thin film transistor may be applied in place of the transistor 203 or 303 for each stage.

In all embodiments, the present invention is applied to the gate driver 103 or shift register 104a or 104a' of the drain driver 104 of the display section 10. However, the present invention can also be applied to read image data from an image sensing element formed by arranging photosensors in a matrix.

Figure 25:
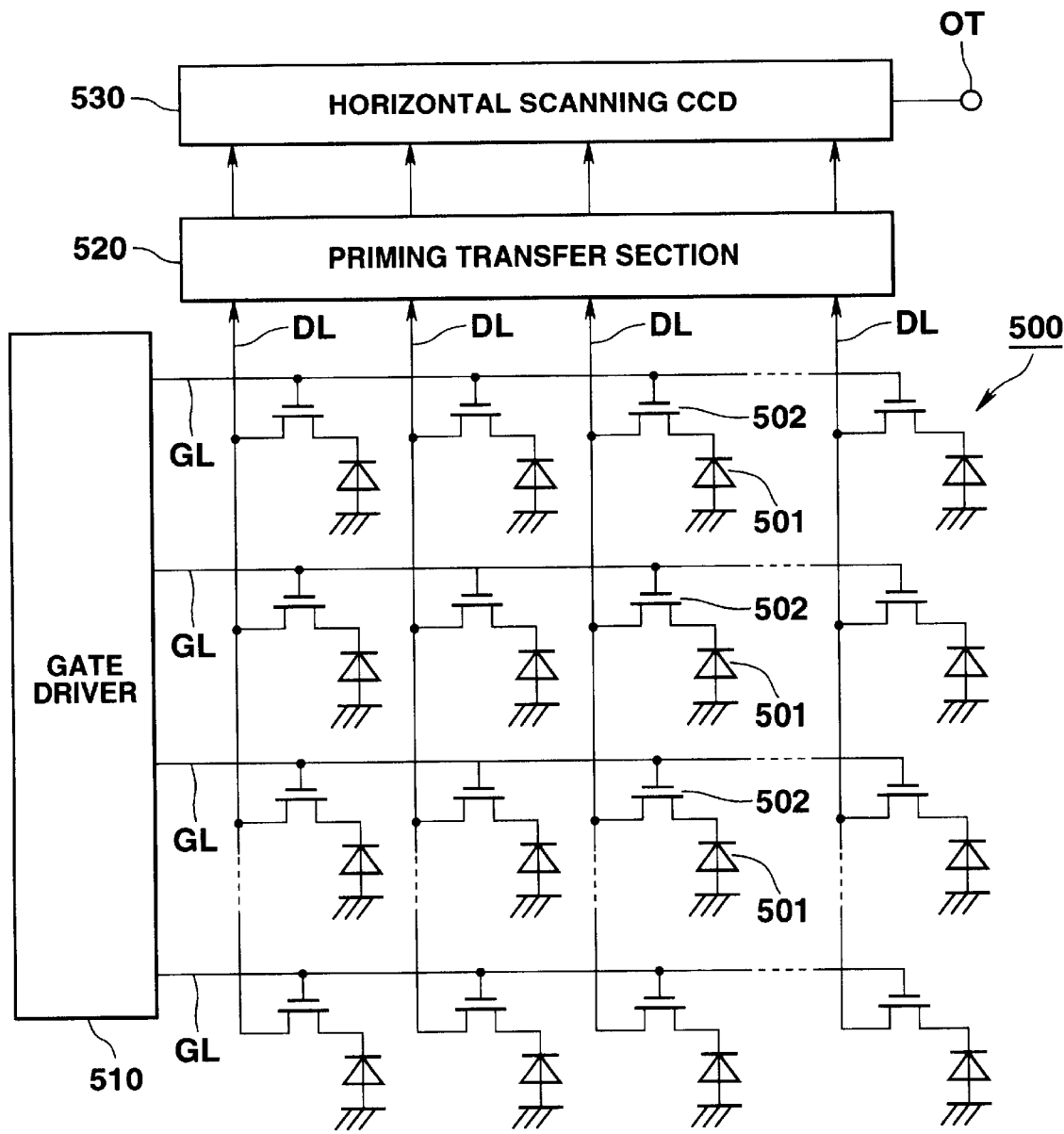
FIG. 25 is a view showing an image sensing element of a modification of the embodiments of the present invention and a driving system thereof.

FIG. 25 is a circuit diagram showing such an image sensing element and its driving system. A photosensor array 500 is formed by arranging photodiodes 501 as light-receiving elements and transistors 502 connected to the photodiodes 501 in a matrix. The gates of the transistors 502 are connected to a gate driver through gate lines GL formed in units of rows. The drains of the transistors 502 are connected to a priming transfer section 520 through drain lines DL formed in units of columns. The priming transfer section 520 injects charges supplied from the photodiode 501 of a selected row through the transistor 502 and drain line DL into a horizontal scanning CCD 530. The horizontal scanning CCD 530 horizontally scans the charges injected from the drain line DL and outputs an image sensing signal from an output terminal OT.

The gate driver shown in FIGS. 5, 8, 18, or 19 described in the first to eighth embodiments can be applied to a gate driver 510. Especially, when the gate driver shown in FIGS. 8 or 21 is used as the gate driver 510, the selection order of the gate lines GL can be reversed only by changing the control signals to the supplied to the gate driver 510. For this reason, as an image based on the image sensing signal output from the output terminal TO, a mirror image inverted in the vertical direction can be easily obtained and applied to, e.g., pattern matching for comparing a photographed image with an image stored in a memory in advance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A shift register comprising a plurality of stages, the stages including:
   a first switching circuit which has a first control terminal for receiving a first or second control signal and outputs a driving signal in accordance with the first or second control signal;
   a second switching circuit which has a second control terminal for receiving the driving signal and discharges a power supply voltage input through a load in accordance with input of the driving signal to the second control terminal; and
   a third switching circuit which has a third control terminal for receiving the driving signal and outputs a third or fourth control signal in accordance with input of the driving signal to the third control terminal.

2. A register according to claim 1, further comprising a fourth switching circuit for, in accordance with the power supply voltage input through the load of a predetermined stage, discharging the driving signal input to a next stage of the predetermined stage through said first switching circuit of the next stage.

3. A register according to claim 1, wherein the third or fourth control signal output from said third switching circuit of a predetermined stage is output to said first switching circuit of a next stage of the predetermined stage as the driving signal.

4. A register according to claim 1, wherein each of said first switching circuits comprises a thin film transistor having a drain for receiving the driving signal and a source for outputting the driving signal, and each of said third switching circuits comprises another thin film transistor having a drain for receiving the third or fourth control signal and a source for outputting the third or fourth control signal.

5. A register according to claim 1, wherein in an odd-numbered stage, the control terminal of said first switching circuit is input the first control signal, and said third switching circuit is input the third control signal, and
   in an even-numbered stage, the control terminal of said first switching circuit is input the second control signal, and said third switching circuit is input the fourth control signal.

6. A register according to claim 1, wherein a level of the third and fourth control signals is inverted at a predetermined period each other, and a level of one of the first and second control signals is inverted in only part of every half period of a level inversion period of the third or fourth control signal.

7. A register according to claim 1, further comprising in each stage of said shift register, a fifth switching circuit which has a control terminal for receiving a fifth control signal and discharges the third or fourth control signal output from said third switching circuit in accordance with input of the fifth control signal.

8. A register according to claim 1, wherein the load has a load switching circuit whose control terminal and drain are applied with the power supply voltage.

9. A register according to claim 1, further comprising in an odd-numbered stage of the stages of said shift register, a first reverse shift switching circuit which has a control terminal for receiving a sixth control signal and outputs the third or fourth control signal output from said third switching circuit of a next stage to the control terminal of said second switching circuit of the odd-numbered stage and the control terminal of said third switching circuit of the odd-numbered stage in accordance with input of the sixth control signal, and
   in an even-numbered stage of the stages of said shift register, a second reverse shift switching circuit which has a control terminal for receiving a seventh control signal and outputs the third or fourth control signal output from said third switching circuit of a next stage to the control terminal of said second switching circuit of the even-numbered stage and the control terminal of said third switching circuit of the even-numbered stage in accordance with input of the seventh control signal.

10. A register according to claim 9, wherein the third or fourth control signal output from said first reverse shift switching circuit or said second reverse shift switching circuit on the basis of the sixth or seventh control signal is input to the control terminal of said second switching circuit of the stage and the control terminal of said third switching circuit of the stage to continuously drive said second switching circuit of the stage and said third switching circuit of the stage after said first switching circuit is turned off and until said first switching circuit is turned on again.

11. A register according to claim 1, wherein the fourth control signal corresponds to a signal obtained by inverting a level of the third control signal.

12. A register according to claim 1, further comprising a selection control circuit for selectively supplying an externally supplied start signal to one of a first stage and a final stage of the stages,
    a first driving circuit for outputting a Kth driving signal from said third switching circuit of a (K−1)th stage to said first switching circuit of a Kth stage and outputting a (K+1)th driving signal from said third switching circuit of the Kth stage to a (K+1)th stage,
    a second driving circuit for outputting a (K+2)th driving signal from said third switching circuit of the (K+1)th stage to the Kth stage and outputting the (K+1)th driving signal from said third switching circuit of the Kth stage to the (K−1)th stage, and
    a shift direction control circuit for selectively driving said first and second driving circuits.

13. A register according to claim 1, wherein said first to third switching circuits are formed from channel field effect transistors of the same type.

14. A shift register comprising a plurality of stages, each of the stages including:
    a first switching circuit which has a control terminal for receiving a first or second control signal and outputs a driving signal to a line in accordance with the first or second control signal;

a second switching circuit which has a control terminal connected to the line and sets a power supply voltage input through a load at a low potential in accordance with input of the driving signal to the control terminal; and a third switching circuit which has a control terminal connected to the line and outputs a third or fourth control signal in accordance with input of the driving signal to the control terminal.

15. A register according to claim 14, further comprising a fourth switching circuit for setting the third or fourth control signal output from said third switching circuit to a low potential in accordance with the power supply voltage input through the load in each stage of said shift register.

16. A register according to claim 14, further comprising a fifth switching circuit which has a control terminal for receiving a fifth control signal and discharges the third or fourth control signal, output from said third switching circuit, in accordance with input of the fifth control signal in each stage of said shift register.

17. A register according to claim 14, wherein the driving signal output from said first switching circuit of a predetermined stage is input to the line between the first switching circuits and the control terminals of said second and third switching circuits of the predetermined stage to continuously drive said second and third switching circuits after said first switching circuit is turned off and until said first switching circuit is turned on again.

18. A register according to claim 14, wherein said first to third switching circuits are formed from channel field effect transistors of a single type.

19. A display device comprising:

a plurality of stages, each of the stages including
    a first switching circuit which has a control terminal for receiving a first or second control signal and outputs a driving signal in accordance with the first or second control signal,
    a second switching circuit which has a control terminal for receiving the driving signal and discharges a power supply voltage, input through a load, in accordance with input of the driving signal to the control terminal, and
    a third switching circuit which has a control terminal for receiving the driving signal and outputs a third or fourth control signal in accordance with input of the driving signal to the control terminal;
a selection driving circuit driven in accordance with an externally supplied start signal; and
a display element having a plurality of pixels arranged for display in accordance with the third or fourth control signal from said selection driving circuit.

20. A device according to claim 19, further comprising a fourth switching circuit for discharging the third or fourth control signal output from said third switching circuit, in accordance with the power supply voltage input through the load in each stage of said selection driving circuit.

21. A device according to claim 19, further comprising a fifth switching circuit which has a control terminal for receiving a fifth control signal and discharging the third or fourth control signal output from said third switching circuit, in accordance with input of the fifth control signal in each stage of said selection driving circuit.

22. A device according to claim 19, further comprising a signal driving circuit for supplying a display signal corresponding to an externally supplied image signal to a pixel selected by said selection driving circuit, and
a control circuit for controlling said selection driving circuit and said signal driving circuit.

23. A device according to claim 19, wherein said selection driving circuit comprises first selection controller for selectively supplying the start signal to one of a first stage and a final stage of the stages, and second selection control means for selecting whether a selection signal received by each stage is to be shifted to a preceding stage or a next stage.

24. A device according to claim 19, further comprising in an odd-numbered stage of the stages of said selection driving circuit, a first reverse shift switching circuit which outputs the third or fourth control signal output from said third switching circuit of a next stage to the control terminal of said second switching circuit of the odd-numbered stage and the control terminal of said third switching circuit of the odd-numbered stage in accordance with input of a sixth control signal, and
in an even-numbered stage of the stages of said selection driving circuit, a second reverse shift switching circuit which outputs the third or fourth control signal output from said third switching circuit of a next stage to the control terminal of said second switching circuit of the even-numbered stage and the control terminal of said third switching circuit of the even-numbered stage in accordance with input of a seventh control signal.

25. A device according to claim 19, wherein when the third or fourth control signal output from each stage of said selection driving circuit is shifted in a direction reverse to a forward direction, said display element displays an image inverted with respect to an alignment direction of the stages of said selection driving circuit against an image obtained in the forward direction.

26. A device according to claim 19, wherein said display element comprises a liquid crystal display element.

27. An image sensing apparatus comprising:

(A) an image sensing element for generating an image signal corresponding to incident light;

(B) a control circuit having a shift register driven in accordance with an externally supplied start signal, said shift register including a plurality of stages, each stage of the stages having
    a first switching circuit which has a control terminal for receiving a first or second control signal and outputs a driving signal in accordance with the first or second control signal,
    a second switching circuit which has a control terminal for receiving the driving signal and discharges a power supply voltage input through a load, in accordance with input of the driving signal to the control terminal, and
    a third switching circuit which has a control terminal for receiving the driving signal and outputs a third or fourth control signal in accordance with input of the driving signal to the control terminal; and (C) a display element having a plurality of pixels and selected on the basis of the third or fourth control signal from said shift register so as to perform display in accordance with an image signal from said image sensing element.

28. An apparatus according to claim 27, further comprising a fourth switching circuit for setting the third or fourth control signal output from said third switching circuit to a low potential in accordance with the power supply voltage input through the load in each stage of said shift register of said control circuit.

29. An apparatus according to claim 27, further comprising a fifth switching circuit which has a control terminal for receiving a fifth control signal and discharges the third or fourth control signal, output from said third switching circuit, in accordance with input of the fifth control signal in each stage of said shift register of said control circuit.

30. An apparatus according to claim 27, wherein said control circuit comprises a first selection controller for selectively supplying the externally supplied start signal to one of a first stage and a final stage of the stages of said shift register, and a second selection controller for selecting whether a selection signal received by each stage is to be shifted to a preceding stage or a next stage.

31. An apparatus according to claim 30, which further comprises vertical direction setting means for setting a vertical direction of an image to be displayed on said display element, said first selection controller selectively supplying an externally supplied selection signal to one of the first stage and the final stage of the stages of said shift register in accordance with the vertical direction of the image, which is set by said vertical direction setting means, and said second selection controller selecting whether the selection signal received by each stage is to be shifted to the preceding stage or the next stage in accordance with the vertical direction of the image, which is set by said vertical direction setting means.

32. An apparatus according to claim 27, further comprising in an odd-numbered stage of the stages of said shift register, a fifth switching circuit which outputs the third or fourth control signal output from said third switching circuit of a next stage of the stages to the control terminal of said second switching circuit of the odd-numbered stage and the control terminal of said third switching circuit of the odd-numbered stage in accordance with input of a fifth control signal, and in an even-numbered stage of the stages of said shift register, a sixth switching circuit which outputs the third or fourth control signal output from said third switching circuit of a next stage of the stages to the control terminal of said second switching circuit of the even-numbered stage and the control terminal of said third switching circuit of the even-numbered stage in accordance with input of a sixth control signal.

* * * * *